(12) United States Patent
Xie et al.

US010283621B2

(10) Patent No.: US 10,283,621 B2
(45) Date of Patent: May 7, 2019

(54) METHOD OF FORMING VERTICAL FIELD EFFECT TRANSISTORS WITH SELF-ALIGNED GATES AND GATE EXTENSIONS AND THE RESULTING STRUCTURE

(71) Applicant: GLOBALFOUNDRIES INC., Grand Cayman (KY)

(72) Inventors: Ruilong Xie, Schenectady, NY (US); Lars Liebmann, Mechanicville, NY (US); Hui Zang, Guilderland, NY (US); Steven Bentley, Menands, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/709,500

(22) Filed: Sep. 20, 2017

(65) Prior Publication Data

US 2019/0088767 A1    Mar. 21, 2019

(51) Int. Cl.
*H01L 29/66* (2006.01)

(52) U.S. Cl.
CPC .... *H01L 29/66666* (2013.01); *H01L 29/6656* (2013.01); *H01L 29/66545* (2013.01)

(58) Field of Classification Search
CPC ......... H01L 29/66666; H01L 29/66545; H01L 29/6656; H01L 29/7827; H01L 21/823885
(Continued)

(56) References Cited

U.S. PATENT DOCUMENTS 5,512,517 A    4/1996  Bryant
6,555,862 B1   4/2003  Mandelman et al.
(Continued)

FOREIGN PATENT DOCUMENTS

TW    201616582 A    5/2016
TW    201719765 A    6/2017
(Continued)

OTHER PUBLICATIONS

Taiwan Application No. 107110281, Examination Report from the Intellectual Property Office dated Oct. 31, 2018 and Search Report dated Oct. 31, 2018, pp. 1-6.

*Primary Examiner* — Tu-Tu V Ho
(74) *Attorney, Agent, or Firm* — Gibb & Riley, LLC; Anthony J. Canale

(57) ABSTRACT

Disclosed is a method of forming an integrated circuit (IC) that incorporates multiple vertical field effect transistors (VFETs) (e.g., in a VFET array). In the method, self-aligned gates for each pair of VFETs and a self-aligned gate extension for contacting those self-aligned gates are essentially simultaneously formed such that the gates wrap around a pair of semiconductor fins, which are in end-to-end alignment, and such that the gate extension fills the space between adjacent ends of those semiconductor fins. By forming self-aligned gates and a self-aligned gate extension for a pair of VFETs, the method avoids the need for lithographically patterning extension cut isolation regions between adjacent pairs of VFETs in a VFET array. Thus, the method enables implementation of VFET array designs with a reduced fin pitch without incurring defects caused, for example, by overlay errors. Also disclosed herein is an IC formed according to the method.

7 Claims, 35 Drawing Sheets

(58) Field of Classification Search
USPC .......................................................... 257/329
See application file for complete search history.

(56) References Cited

U.S. PATENT DOCUMENTS

| | | |
|---|---|---|
| 6,861,701 B2 | 3/2005 | Williams et al. |
| 9,536,793 B1 | 1/2017 | Zhang et al. |
| 9,548,385 B1 | 1/2017 | Cheng et al. |
| 9,590,085 B2 | 3/2017 | Leobandung |
| 9,711,618 B1 | 7/2017 | Cheng et al. |
| 9,735,253 B1 | 8/2017 | Bi et al. |
| 9,954,102 B1 * | 4/2018 | Mochizuki .......... H01L 29/6653 |
| 2015/0287821 A1 | 10/2015 | Masuoka et al. |
| 2017/0222021 A1 | 8/2017 | Mallela et al. |

FOREIGN PATENT DOCUMENTS

| | | |
|---|---|---|
| TW | 201730938 A | 9/2017 |
| TW | 201733005 A | 9/2017 |

* cited by examiner

US 10,283,621 B2

METHOD OF FORMING VERTICAL FIELD EFFECT TRANSISTORS WITH SELF-ALIGNED GATES AND GATE EXTENSIONS AND THE RESULTING STRUCTURE

BACKGROUND

Field of the Invention

The present invention relates to vertical field effect transistors (VFETs) and, more particularly, to a method of forming multiple VFETs with self-aligned gates and gate extensions and the resulting integrated circuit (IC) structure.

Description of Related Art

Integrated circuit (IC) design decisions are often driven by device scalability, device density, device performance, manufacturing efficiency and costs. For example, IC designs may incorporate non-planar field effect transistor (FET) structures because non-planar FETs consume less chip surface area than planar FETs. Additionally, non-planar FETs exhibit multi-dimensional field effects as compared to the single-dimensional field effects exhibited by planar FETs and, thus, non-planar FETs exhibit improved gate control over the channel region. Exemplary non-planar FETs include, for example, standard fin-type FETs (FINFETs) and vertical fin-type FETs (VFETs). A FINFET is a non-planar FET that incorporates a semiconductor fin (i.e., a relatively tall and thin, rectangular-shaped, semiconductor body) and, within the semiconductor fin, a channel region positioned laterally between source/drain regions. A gate is positioned adjacent to the top surface and opposing sidewalls of the semiconductor fin at the channel region. A VFET is a non-planar FET that also incorporates a semiconductor fin (i.e., a relatively tall and thin, rectangular-shaped, semiconductor body). In this case, the FET components are stacked vertically on a substrate as opposed to being positioned side by side across a substrate in order to allow for increased device density (i.e., a greater number of devices within a given area). Specifically, a VFET typically includes a lower source/drain region in a substrate, a semiconductor fin that extends upward from the lower source/drain region, and an upper source/drain region that is epitaxially grown on the top surface of the semiconductor fin. A gate (e.g., a metal gate) laterally surrounds the semiconductor fin, which functions as the channel region, and is electrically isolated from the lower source/drain region and the upper source/drain region by lower and upper spacer layers, respectively. Unfortunately, as the device density (i.e., the number of devices per unit area) included in IC design specifications continues to be increased, forming the above-mentioned non-planar FETs without violating design rules and/or risking the formation of defects (e.g., shorts) can be difficult.

SUMMARY

In view of the foregoing, disclosed herein are embodiments of a method of forming an integrated circuit (IC) that incorporates multiple vertical field effect transistors (VFETs) (e.g., in a VFET array). In the method, self-aligned gates for each pair of VFETs and a self-aligned gate extension for contacting those self-aligned gates are essentially simultaneously formed. The resulting gates wrap around a pair of semiconductor fins, which are in end-to-end alignment, and the resulting gate extension fills the space between adjacent ends of the semiconductor fins. By forming self-aligned gates and a self-aligned gate extension for each pair of VFETs, the method avoids the need for lithographically patterning extension cut isolation regions between adjacent pairs of VFETs in a VFET array. Thus, the method enables implementation of VFET array designs with a reduced fin pitch (e.g., of 36 nm or less) without incurring defects caused, for example, by overlay errors. Also disclosed herein are integrated circuit (IC) structures formed according to the disclosed method embodiments.

More particularly, disclosed is an embodiment of a method of forming an integrated circuit (IC) that incorporates at least one pair of vertical field effect transistors (VFETs). In this embodiment, an opening can be formed such that it extends essentially vertically through a conformal sacrificial gate layer and through a capped semiconductor fin and into a substrate and, thereby such that it divides the capped semiconductor fin into a pair of semiconductor fins having sacrificial fin caps. An isolation region can be formed in the bottom of the opening and a sacrificial region, which is made of the same sacrificial material as the sacrificial gate layer, can be formed above the isolation region. The sacrificial material of both the sacrificial gate layer and the sacrificial region can then be recessed (i.e., etched back) to form a recess. The recess will wrap around the upper portions of the semiconductor fins and the sacrificial fin caps on those semiconductor fins and will further extend laterally between adjacent ends of the semiconductor fins. The recess can then be filled with dielectric spacer material to form an upper dielectric spacer.

During subsequent processing, the remaining sacrificial material can be selectively removed and the upper dielectric spacer can be used as a mask during gate and gate extension formation. Given the position of various portions of the upper dielectric spacer relative to the semiconductor fins, the resulting self-aligned gates will be positioned laterally adjacent to outer ends and opposing sides of the semiconductor fins and the resulting self-aligned gate extension will be within a space that is above the isolation region and that extends laterally between and is in direct contact with the adjacent ends of the semiconductor fins and with the gates. Interlayer dielectric material (ILD) can subsequently be deposited to electrically isolate the self-aligned gates and the self-aligned gate extension of the pair of VFETs from self-aligned gates and a self-aligned gate extension of any other pair of VFETs formed on the substrate.

Also disclosed is an embodiment of a method of forming an integrated circuit (IC) structure that incorporates multiple pairs of vertical field effect transistors (VFETs). In this embodiment, openings can be formed such that they extend through a conformal sacrificial gate layer that covers multiple capped semiconductor fins, wherein each opening further extends through one of the capped semiconductor fins below the sacrificial gate layer and into a substrate. Thus, the openings divide each of the capped semiconductor fins into a pair of semiconductor fins having sacrificial fin caps. Isolation and sacrificial regions can be formed in the openings. That is, within each opening, an isolation region can be formed at the bottom of the opening and a sacrificial region, which is made of the same sacrificial material as the sacrificial gate layer, can be formed above that isolation region. The sacrificial material of the sacrificial gate layer and the sacrificial regions can then be recessed (e.g., etched back) to form recesses. Each recess will extend laterally between adjacent ends of the semiconductor fins in a corresponding pair of semiconductor fins and will further wrap around the upper portions of the semiconductor fins in that corresponding pair and sacrificial fin caps on those semiconductor fins. The recesses can then be filled with dielectric spacer material to form upper dielectric spacers, respectively.

During subsequent processing, the remaining sacrificial material can be selectively removed and the upper dielectric spacers can be used as masks during gate and gate extension formation. Given the position of various portions of each upper dielectric spacer relative to the semiconductor fins in the corresponding pair of semiconductor fins, the resulting self-aligned gates will be positioned laterally adjacent to outer ends and opposing sides of the semiconductor fins in the corresponding pair and the resulting self-aligned gate extension will be within a space that is above the isolation region and that extends laterally between and is in direct contact with the adjacent ends of the semiconductor fins in the corresponding pair and with the gates on those semiconductor fins. Interlayer dielectric material (ILD) can subsequently be deposited to electrically isolate the self-aligned gates and the self-aligned gate extension of each pair of VFETs from the self-aligned gates and self-aligned gate extension of any other pair of VFETs.

Optionally, at least one extension cut isolation region can also be formed. The extension cut isolation region can, for example, be formed so that it extends through the ILD material, through one of the upper dielectric spacers and through the gate extension between one of the pairs of semiconductor fins (i.e., in a selected pair of VFETs), thereby electrically isolating the self-aligned gates of the selected pair of VFETs from each other.

Also disclosed herein are integrated circuit (IC) structure embodiments formed according to the above-describe method embodiments. The IC structure can include a substrate and a pair of vertical field effect transistors (VFETs) on a substrate. The pair of VFETs can include a pair of semiconductor fins. The semiconductor fins in the pair can be arranged in end-to-end alignment. The semiconductor fins in the pair can further extend essentially vertically between lower source/drain regions in the substrate and upper source/drain regions, respectively. Self-aligned gates can be positioned laterally adjacent to outer ends and opposing sides of the semiconductor fins. A self-aligned gate extension can be above an isolation region and can extend laterally between and be in direct contact with adjacent ends of the semiconductor fins and with the gates. The IC structure can further include an upper dielectric spacer, which is above the gate extension and also above the gates so that it wraps around the upper source/drain regions. Optionally, the IC structure can further include a second pair of VFETs on the substrate. The second pair of VFETs can be positioned parallel and adjacent to the pair of VFETs described above (e.g., as part of a VFET array). Each pair of VFETs can be configured in the same way. Thus, for example, the second pair of VFETs can include a second pair of semiconductor fins, second self-aligned gates and a second self-aligned gate extension. Interlayer dielectric (ILD) material can electrically isolate the self-aligned gates and gate extension of one pair of VFETs from the self-aligned gates of any other pair of VFETs.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
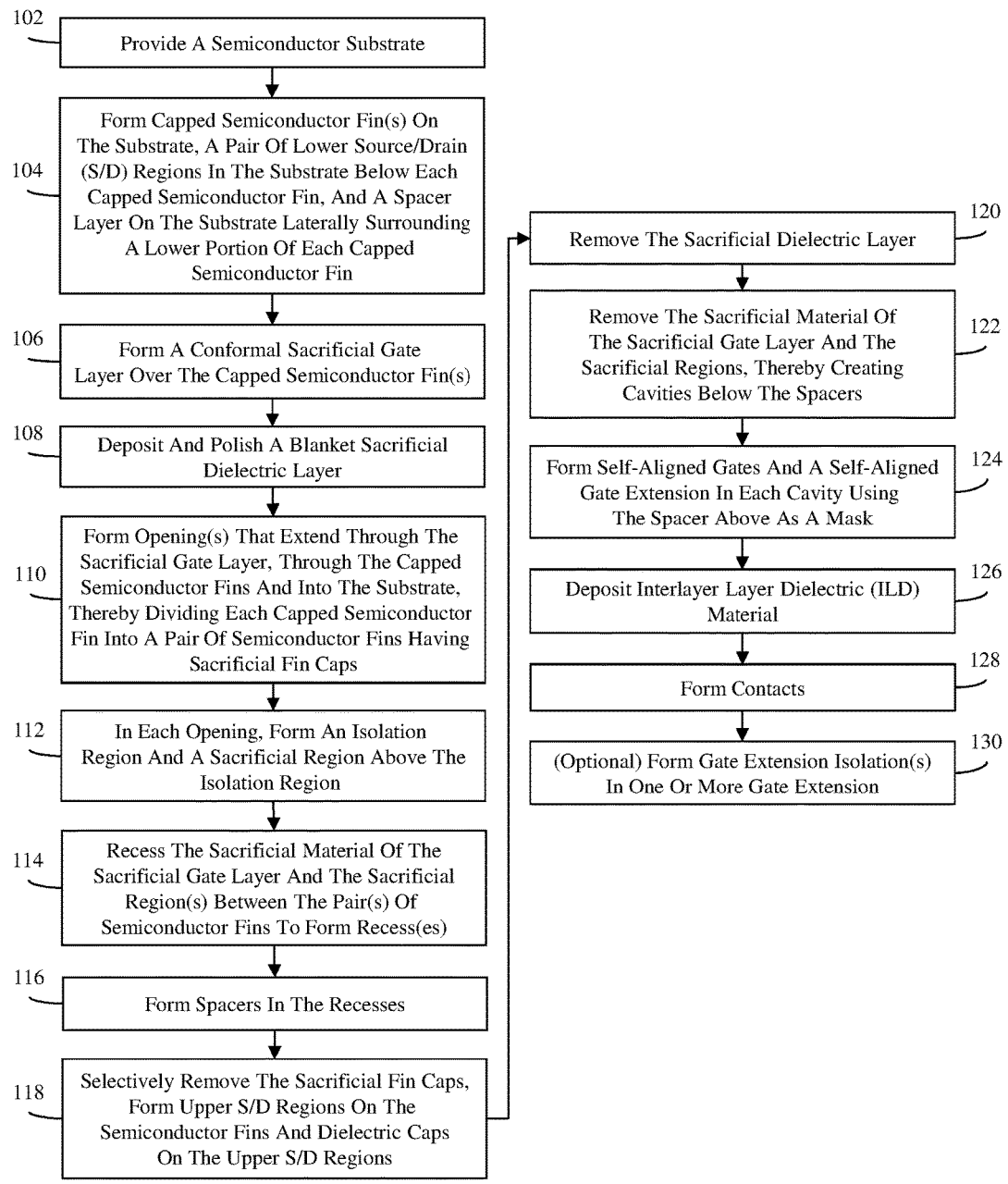
FIG. 1 is a flow diagram illustrating embodiments of a method of forming an integrated circuit (IC) that incorporates one or more pairs of vertical field effect transistors (VFETs)
Figure 2A:
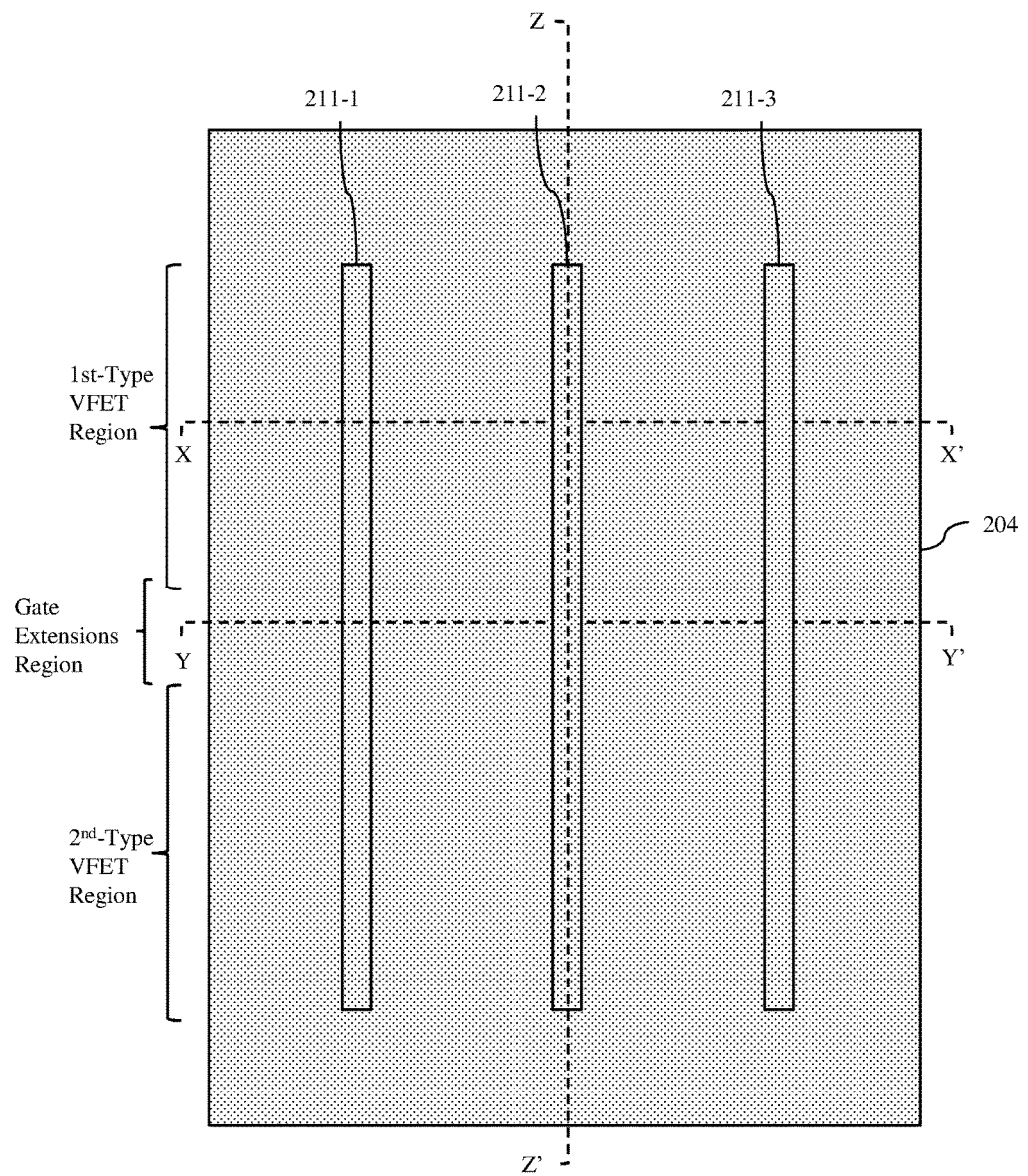
FIG. 2A is a top view diagram and FIGS. 2B-2D are different cross-section diagrams illustrating a partially completed IC structure formed according to the flow diagram of FIG. 1.
Figure 2B:
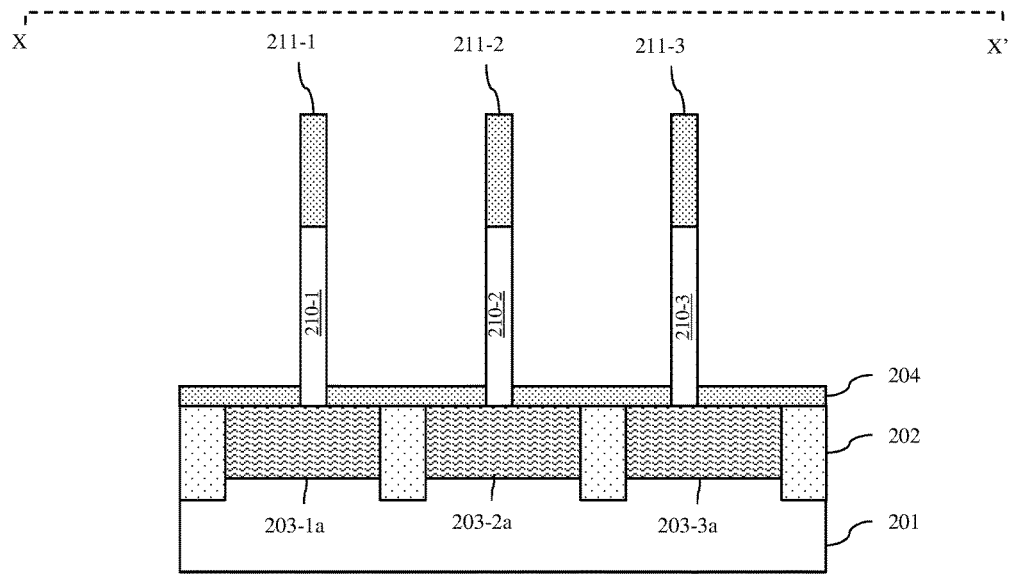
Figure 2C:
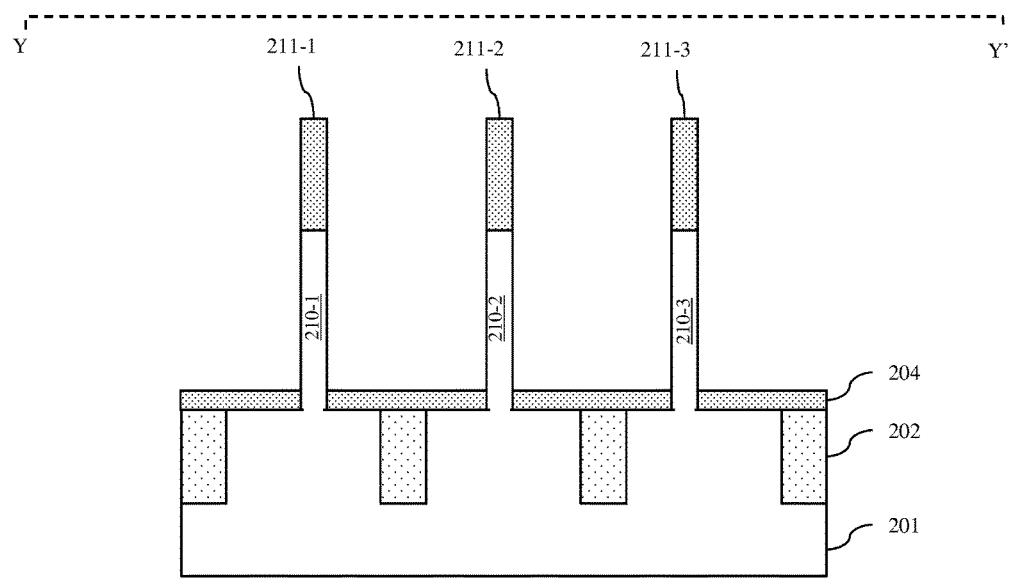
Figure 2D:
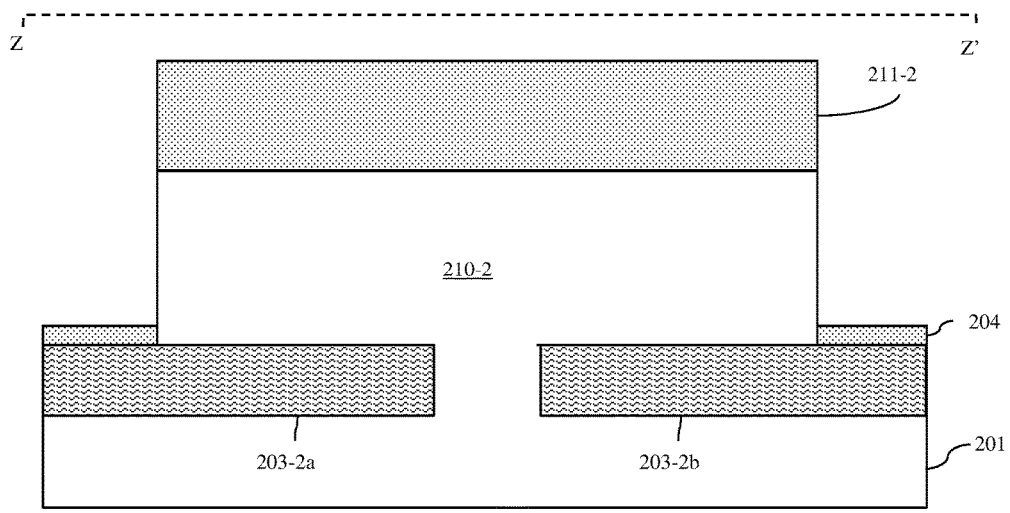

As mentioned above, as the device density (i.e., the number of devices per unit area) included in IC design specifications continues to be increased, forming the above-mentioned non-planar FETs without violating design rules and/or risking the formation of defects (e.g., shorts) can be difficult. For example, an IC design may include an array of vertical field effect transistors (VFETs) that incorporates a row of P-type VFETs adjacent to a row of N-type VFETs. With each new design generation, the specified fin pitch is reduced in order to increase VFET density within each row in the array and the reduction in fin pitch requires a corresponding reduction in the gate pitch in order to minimize parasitic capacitance. In VFETs, gate pitch reduction can be achieved through the formation of self-aligned gates. However, since the self-aligned gates are aligned below upper source/drain regions, gate extension(s) are required in order to provide a landing surface for gate contacts. In an exemplary VFET array, which includes VFETs with self-aligned gates, a gate extension can be formed such that it is parallel to and between the two rows of VFETs and further such that it is in contact with the self-aligned gates of the P-type VFETs on one side and with the self-aligned gates of the N-type VFETs on the opposite side. Cuts can subsequently be formed (e.g., lithographically patterned and etched) in the gate extension at one or more locations and filled with isolation material to form extension cut isolation regions. The extension cut isolation regions can include a first type that traverse the width of the gate extension in an area offset from any semiconductor fins in order to electrically isolate the P-type and N-type VFETs in one portion of the array from the P-type and N-type VFETs in another portion (e.g., to electrically isolate a pair of P-type and N-type VFETs, which are electrically connected to the gate extension opposite each other, from other VFETs in the array). The extension cut isolation regions can also include a second type that traverse the width of the gate extension between the self-aligned gates of a pair of P-type and N-type VFETs, which are electrically connected to the gate extension opposite each other, so as to electrically isolate the P-type VFET and the N-type VFET in that pair from each other. However, given current state of the art minimum lithographic dimensions, any further reductions in fin pitch (e.g., to 36 nm or less) will make lithographically patterning the cuts for the extension cut isolation regions and, particularly, for the first type of extension cut isolation regions, discussed above, difficult to perform without resulting in overlay errors that can cause defects.

In view of the foregoing, disclosed herein are embodiments of a method of forming an integrated circuit (IC) that incorporates multiple vertical field effect transistors (VFETs) (e.g., in a VFET array). In the method, self-aligned gates for each pair of VFETs and a self-aligned gate extension for contacting those self-aligned gates are essentially simultaneously formed. The resulting gates wrap around a pair of semiconductor fins, which are in end-to-end alignment, and the resulting gate extension fills the space between adjacent ends of the semiconductor fins. By forming self-aligned gates and a self-aligned gate extension for each pair of VFETs, the method avoids the need for lithographically patterning extension cut isolation regions between adjacent pairs of VFETs in a VFET array. Thus, the method enables implementation of VFET array designs with a reduced fin pitch (e.g., of 36 nm or less) without incurring defects caused, for example, by overlay errors. Also disclosed herein are integrated circuit (IC) structures formed according to the disclosed method embodiments.

More particularly, referring to the flow diagram of FIG. 1, disclosed are embodiments of a method of forming an integrated circuit (IC) that incorporates one or more pairs of vertical field effect transistors (VFETs) (e.g., in a VFET array).

The method can include providing a substrate 201 (see process 102). The substrate 201 can be a bulk semiconductor substrate (e.g., a bulk silicon substrate), as illustrated in FIGS. 2A-2D. Alternatively, the substrate 201 can be a semiconductor layer above an insulator layer of a semiconductor-on-insulator wafer (e.g., a silicon layer above a buried oxide layer of a silicon-on-insulator (SOI) wafer).

One or more capped semiconductor fins can be formed on the semiconductor substrate 201 (see process 104). For purposes of this disclosure, a semiconductor fin refers to an elongated, relatively tall and thin, essentially rectangular-shaped semiconductor body. A capped semiconductor fin refers to a semiconductor fin that is capped with a dielectric fin cap (e.g., a silicon nitride fin cap). Capped semiconductor fins can be patterned and etched into the upper portion of the semiconductor substrate. Techniques for patterning capped semiconductor fins (e.g., conventional lithographic patterning techniques, sidewall image transfer patterning techniques, etc.) are well known in the art and, thus, the details of such techniques have been omitted from the specification in order to allow the reader to focus on the salient aspects of the disclosed embodiments. For purposes of illustration, three semiconductor fins 210-1, 210-2 and 210-3 with dielectric fin caps 211-1, 211-2 and 211-3, respectively, are shown FIGS. 2A-2D and the method will be described below with respect to the formation of three pairs of VFETs using these three capped semiconductor fins. However, it should be understood that the figures are not intended to be limiting and that, alternatively, any number of one or more capped semiconductor fins could be formed and used to form one or more pairs of VFETs, respectively.

Additionally, for each pair of VFETs, a pair of lower source/drain regions can be formed either before or after formation of the capped semiconductor fin(s). Each pair of lower source/drain regions will be in the substrate below different halves of a capped semiconductor fin. The VFETs in each pair of VFETs can be formed so as to have the same type conductivity. However, typically, the VFETs in each pair of VFETs will be formed so as to have different type conductivities. That is, each pair of VFETs will be formed so as to include a P-type VFET and an N-type VFET. In this case, each pair of lower source/drain regions below a capped semiconductor fin will include a P+ lower source/drain region for a P-type VFET aligned below one half of the capped semiconductor fin and an N+ lower source/drain region for n N-type VFET below another half of the same capped semiconductor fin. The lower S/D regions could be formed, for example, as dopant implant regions, doped epitaxial semiconductor regions, etc. Various different techniques for forming such lower source/drain regions for VFETs are well known in the art and, thus, the details of those techniques have been omitted from this specification in order to allow the reader to focus on the salient aspects of the disclosed methods. It should be noted that in the figures, items 203-1*a* and *b* refer to the lower source/drain regions below the first capped semiconductor fin 210-1, items 203-2*a* and *b* refer to the lower source/drain regions below the second capped semiconductor fin 210-2, and items 203-3*a-b* refer to the lower source/drain regions below the third capped semiconductor fin 210-3.

Additionally, shallow trench isolation (STI) regions 202 can be formed within the substrate 201 parallel to and between the capped semiconductor fins 210-1, 210-2, 210-3 so as to electrically isolated the lower source/drain regions below one capped semiconductor fin from the lower source/drain regions below another. Various different techniques for forming STI regions are well known in the art and, thus, the details of these techniques have been omitted from this specification in order to allow the reader to focus on the salient aspects of the disclosed methods.

Subsequently, a lower dielectric spacer layer 204 can be deposited onto the partially completed structure so that the lower dielectric spacer layer 204 covers the top surface of the substrate 201, but only laterally surrounds the lower portion of each capped semiconductor fin 210-1, 210-2 and 210-3. For example, the lower dielectric spacer layer 204 could be deposited using a directional deposition process such as a gas cluster ion beam (GCIB) deposition process or a high-density plasma (HDP) deposition process. Alternatively, a blanket layer of dielectric spacer material could be deposited, (optionally) polished using a, for example, a chemical mechanical polishing (CMP) process, and recessed (i.e., etched back). In any case, as illustrated, the lower dielectric spacer layer 204 will specifically cover exposed portions of the lower source/drain regions in the substrate and will also cover the STI regions 202. The lower dielectric spacer layer 204 can, for example, be made of a low-K dielectric material. Those skilled in the art will recognize that a low-K dielectric material is a dielectric material having a dielectric constant that is lower than the dielectric constant of silicon dioxide and, particularly, that is lower than 3.9. One exemplary low-K dielectric material that could be used for the lower dielectric spacer layer 204 is hydrogenated silicon oxycarbide (SiOCH). Alternatively, any other suitable dielectric spacer material having, for example, a dielectric constant ranging from 3-7, could be used (e.g., silicon nitride (SiN), nitrogen-doped silicon oxycarbide (SiOCN), siliconborn carbon nitride (SiBCN), etc.). It should be noted that the lower dielectric spacer layer 204 should, in any case, be made of a different dielectric material than the dielectric fin caps 211-1, 211-2 and 211-3 so that the lower dielectric spacer layer 204 can be selectively etched back without also removing the dielectric fin caps 211-1, 211-2 and 211-3.

Figure 3A:
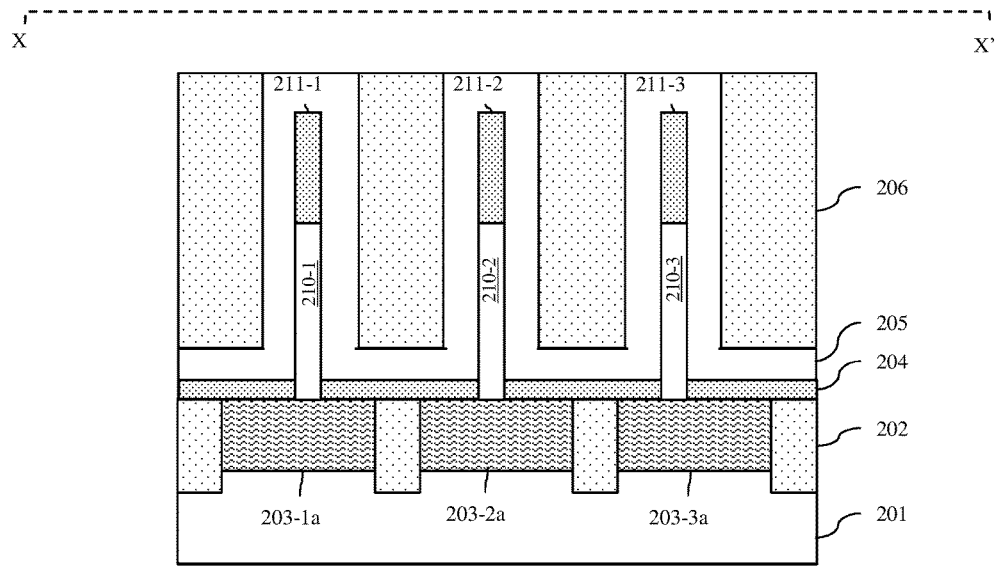
FIGS. 3A-3C are different cross-section diagrams illustrating a partially completed IC structure formed according to the flow diagram of FIG. 1.
Figure 3B:
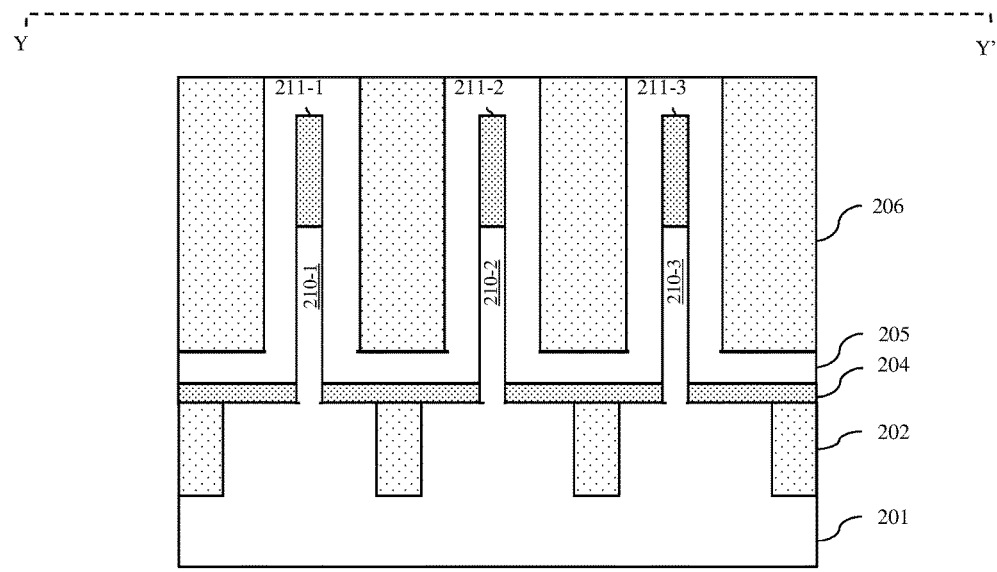
Figure 3C:
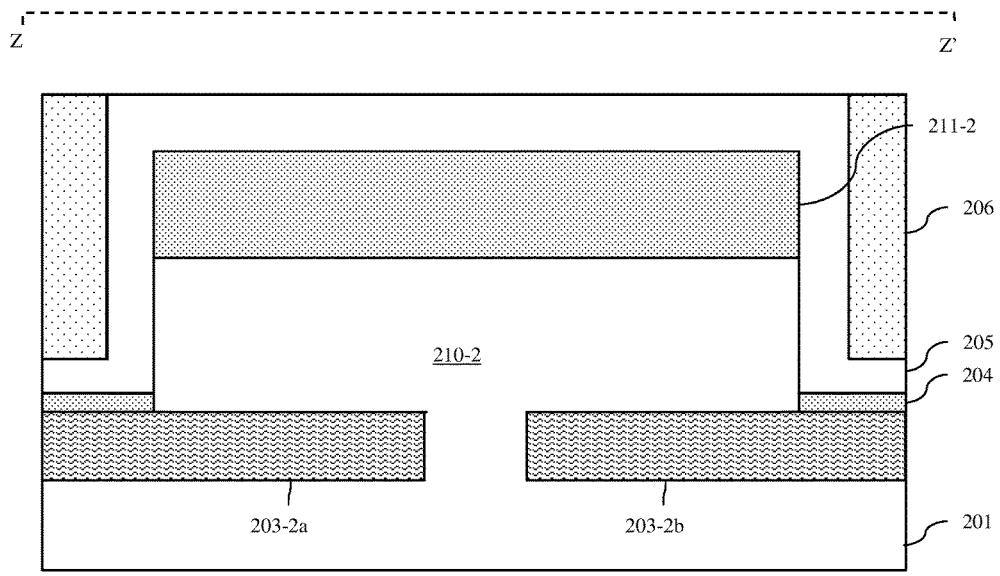
Figure 4A:
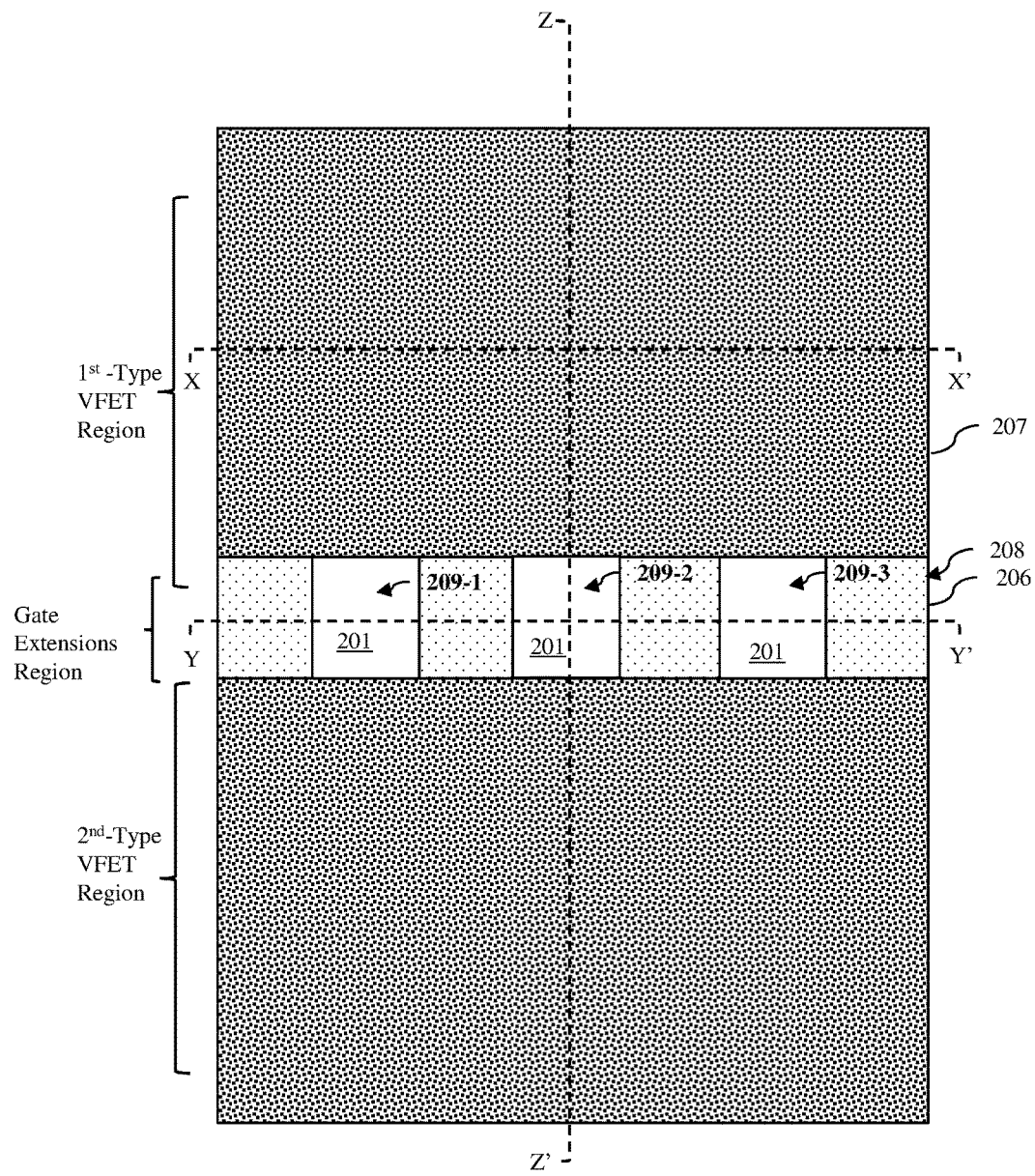
FIG. 4A is a top view diagram and FIGS. 4B-4D are different cross-section diagrams illustrating a partially completed IC structure formed according to the flow diagram of FIG. 1.
Figure 4B:
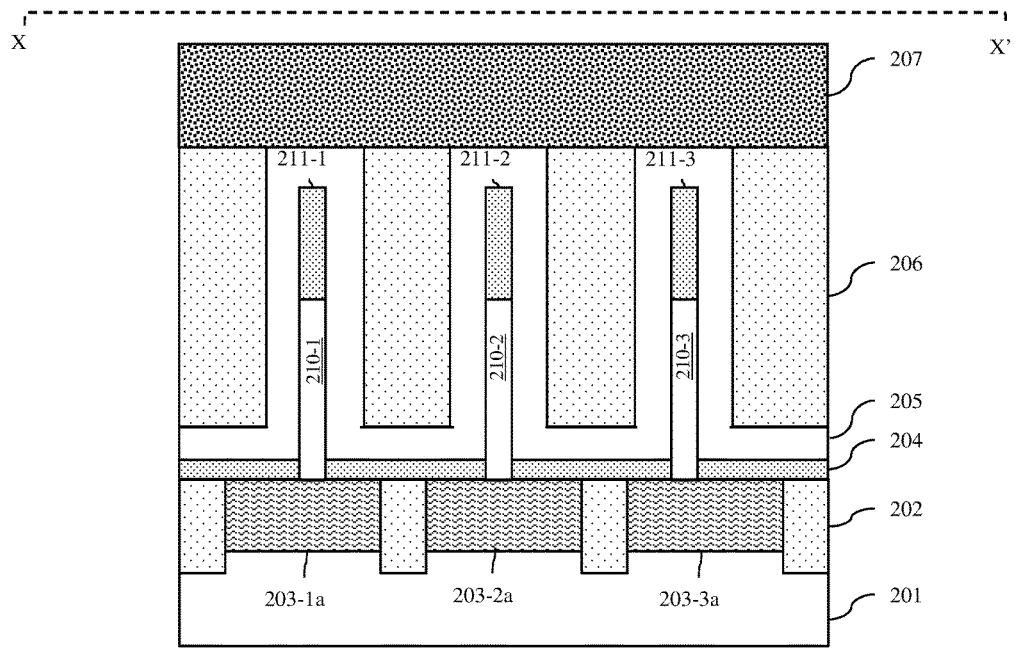
Figure 4C:
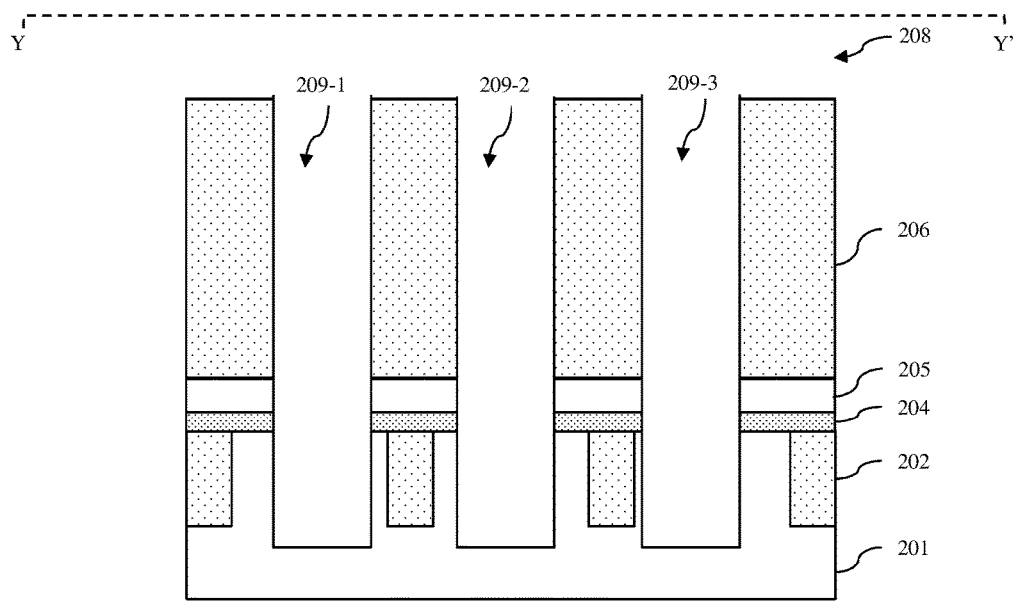
Figure 4D:
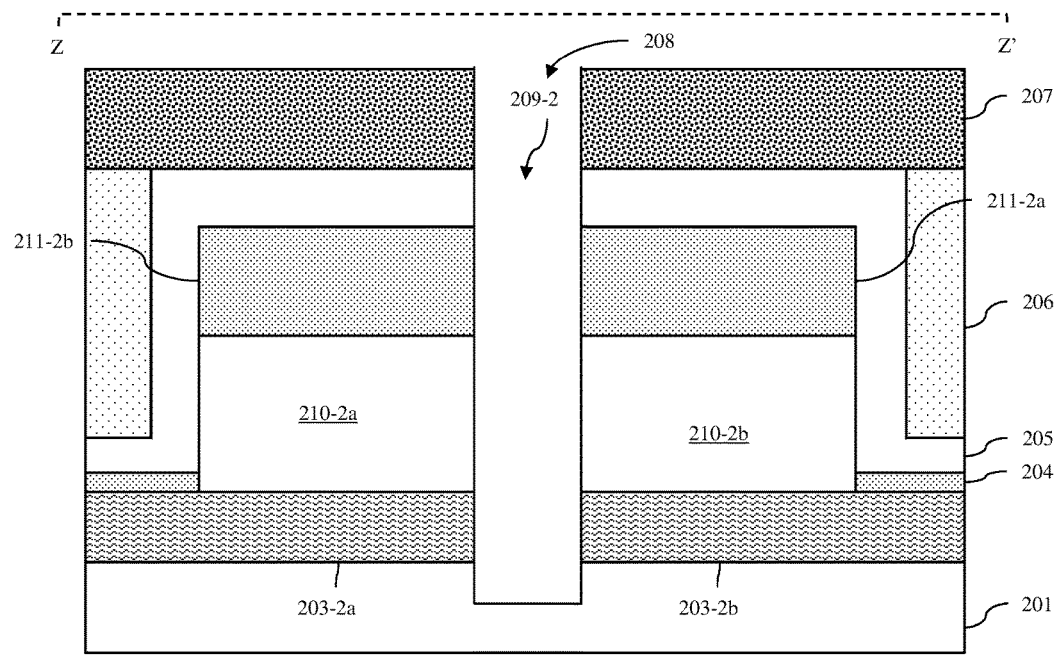

Next, a conformal sacrificial gate layer 205 can be formed over the capped semiconductor fins 210-1, 210-2 and 210-3 (see process 106 and FIGS. 3A-3C). For example, the sacrificial gate layer 205 could be formed by depositing a thin conformal layer of silicon dioxide (e.g., using an atomic layer deposition (ALD) process) and a conformal layer of amorphous silicon (a-Si) on the thin conformal layer of silicon dioxide. Following formation of the sacrificial gate layer 205, a blanket layer of sacrificial dielectric material 206 can be deposited and a polishing process (e.g., a CMP) process can be performed in order to expose the top surface of the sacrificial gate layer 205 (see process 108 and FIGS. 3A-3C). The sacrificial dielectric material 206 can, for example, be silicon dioxide.

A mask layer 207 (e.g., an optical polymerization layer (OPL)) can be formed over the partially completed structure (i.e., on the top surface of the exposed portions of the sacrificial gate layer 205 and the sacrificial dielectric material 206). This mask layer 207 can further be lithographically patterned with a trench 208 that traverses the capped semiconductor fins 210-1, 210-2 and 210-3 at approximately the midline. Then, a selective anisotropic etch process can be performed in order to form, within the trench 208, openings 209-1, 209-2 and 209-3, which extend vertically through the sacrificial gate layer 205 and further through the capped semiconductor fins 210-1, 210-2 and 210-3, and into the substrate 201 (e.g., to a depth at or below the same depth as the STI regions 202) (see process 110 and FIGS. 4A-4D). Each opening can specifically extend through one of the capped semiconductor fins below the sacrificial gate layer 205 such that the openings 209-1, 209-2 and 209-3 divide the capped semiconductor fins 210-1, 210-2 and 210-3 into pairs of semiconductor fins having sacrificial fin caps. That is, as illustrated, capped semiconductor fin 210-1 is divided into a pair of semiconductor fins 210-1a and b with sacrificial fin caps 211-1a and b; capped semiconductor fin 210-2 is divided into a pair of semiconductor fins 210-2a and b with sacrificial fin caps 211-2a and b; and capped semiconductor fin 210-3 is divided in a pair of semiconductor fins 210-3a and b with sacrificial fin caps 211-3a and b.

Figure 5A:
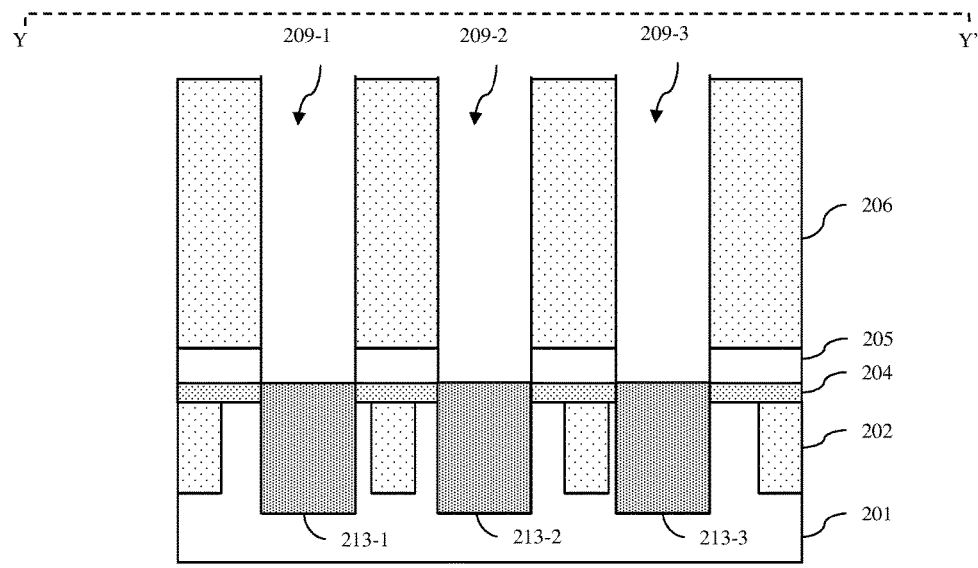
FIGS. 5A-5B are different cross-section diagrams illustrating a partially completed IC structure formed according to the flow diagram of FIG. 1.
Figure 5B:
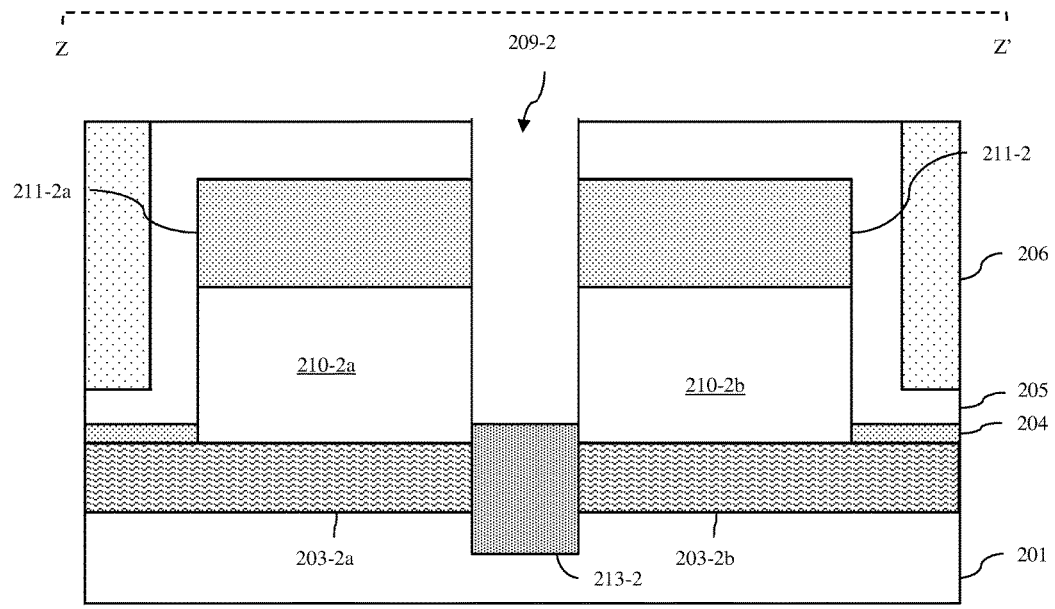
Figure 6A:
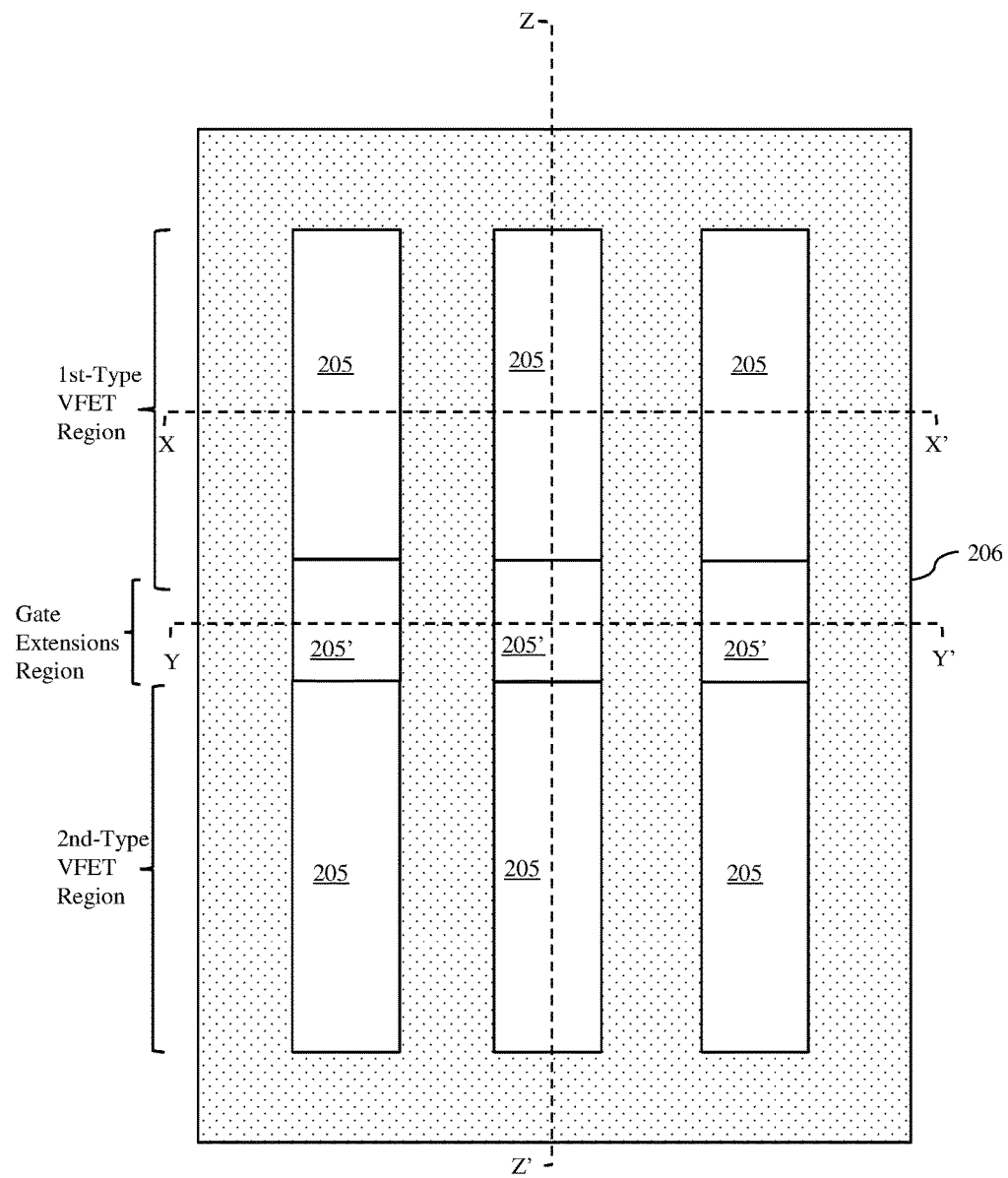
FIG. 6A is a top view diagram and FIGS. 6B-6D are different cross-section diagrams illustrating a partially completed IC structure formed according to the flow diagram of FIG. 1.
Figure 6B:
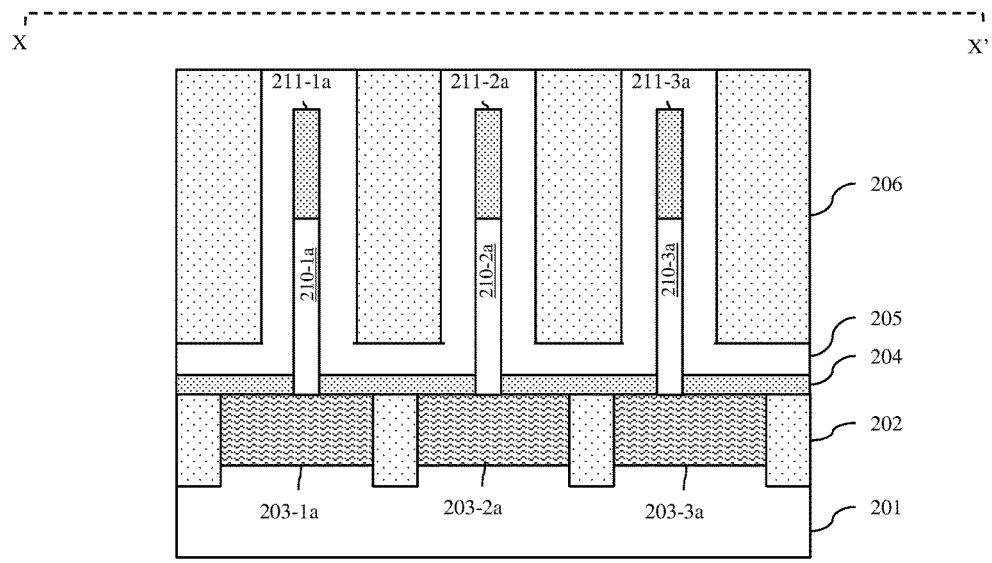
Figure 6C:
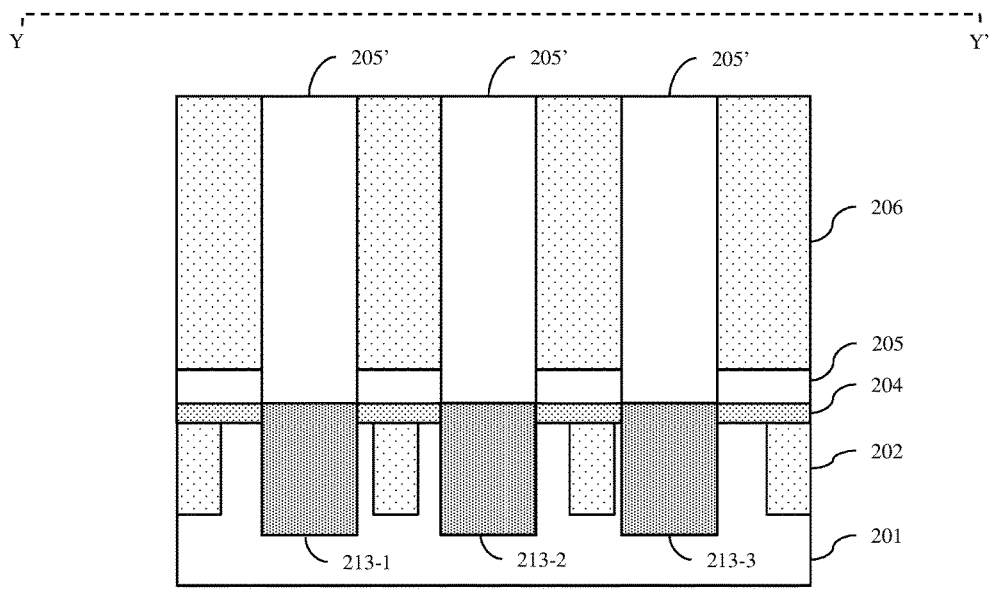
Figure 6D:
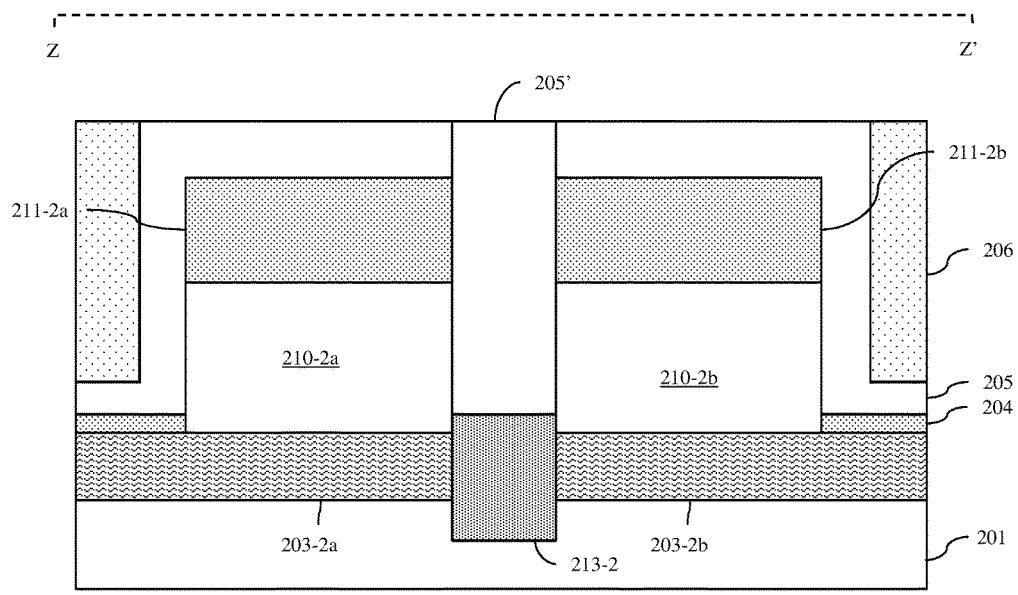

After the openings 209-1, 209-2 and 209-3 are formed, an isolation material (e.g., silicon nitride or any other suitable isolation material) can be deposited and selectively recessed (i.e., etched back) in order to form isolation regions 213-1, 213-2 and 213-3 at the bottom of each opening 209-1, 209-2 and 209-3 (see process 112 and FIGS. 5A-5B). Thus, each isolation region 213-1, 213-2 and 213-3 will be located in the substrate 201 and positioned laterally between a corresponding pair of lower source/drain regions 203-1a and b, 203-2a and b, and 203-3a and b, respectively. The process of recessing the isolation material should specifically be performed such that the top surfaces of the remaining isolation regions are at or above the top surface of the substrate 210 (and particularly at or above the top surfaces of the lower source/drain regions). For example, the isolation material can be recessed so that the top surfaces of the remaining isolation regions are approximately level with the top surface of the lower dielectric spacer layer 204.

Subsequently, sacrificial regions 205' can be formed within the openings 209-1, 209-2 and 209-3 above the isolation regions 213-1, 213-2 and 213-3 (see FIGS. 6A-6D). For example, the same sacrificial material(s) used for the sacrificial gate layer 205 (e.g., a thin conformal silicon dioxide layer and an amorphous silicon layer) can be deposited so as to fill the remaining portions of the openings 209-1, 209-2 and 209-3 above the isolation regions 213-1, 213-2 and 213-3 and a polishing process (e.g., a CMP process) can be performed in order to remove any of the sacrificial material from above the level of the top surface of the layer of sacrificial dielectric material 206, thereby forming the sacrificial regions 205'.

Figure 7A:
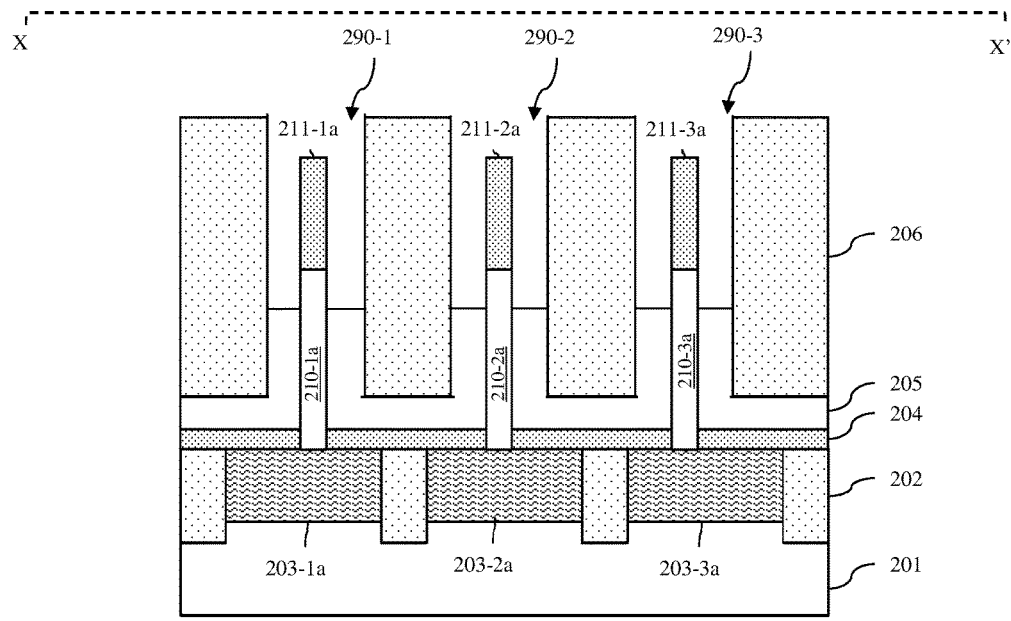
FIGS. 7A-7C are different cross-section diagrams illustrating a partially completed IC structure formed according to the flow diagram of FIG. 1.
Figure 7B:
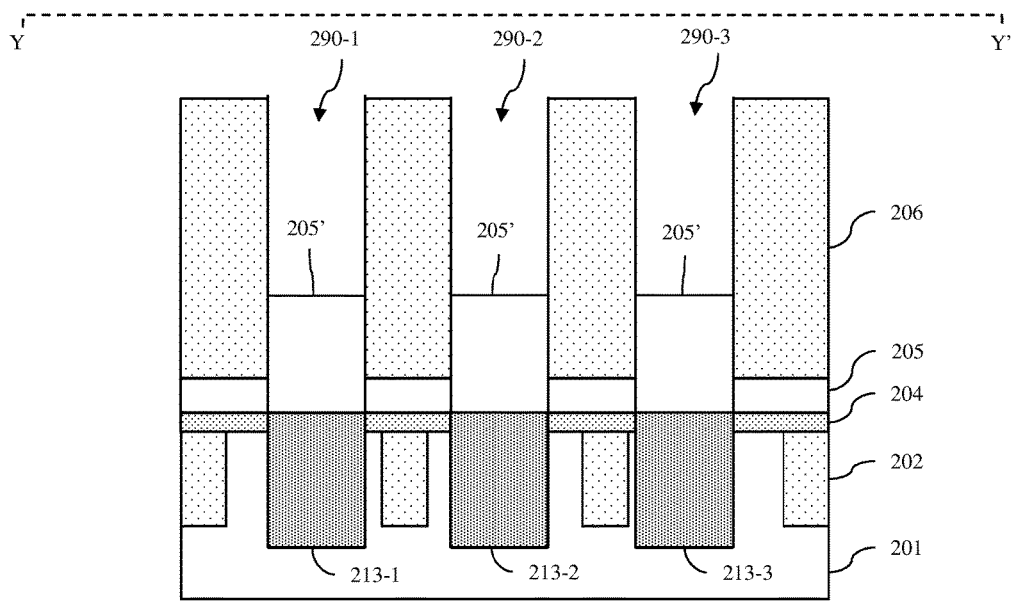
Figure 7C:
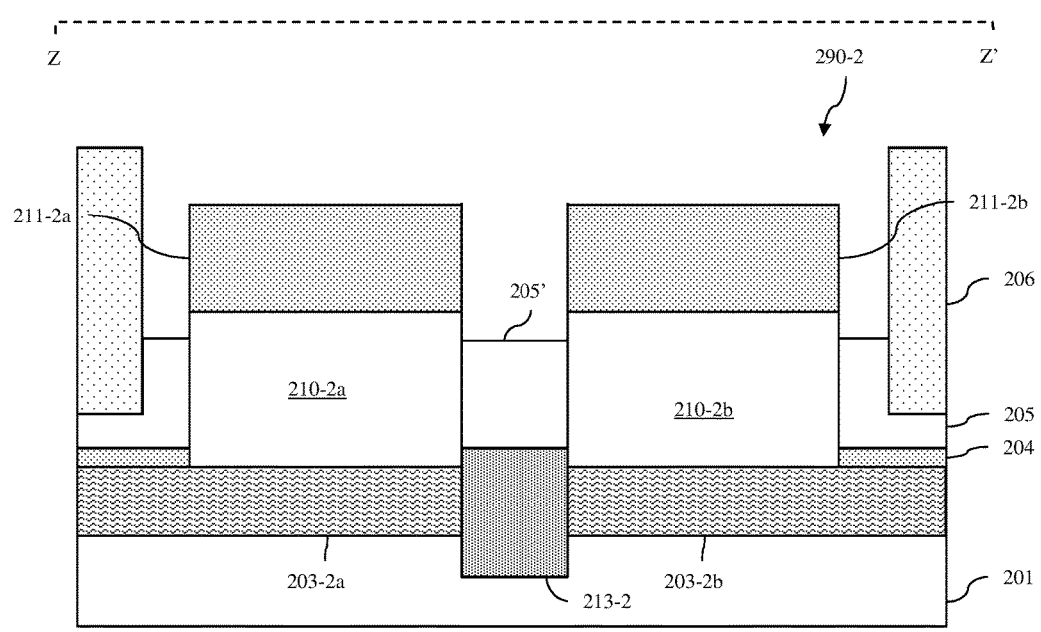
Figure 8A:
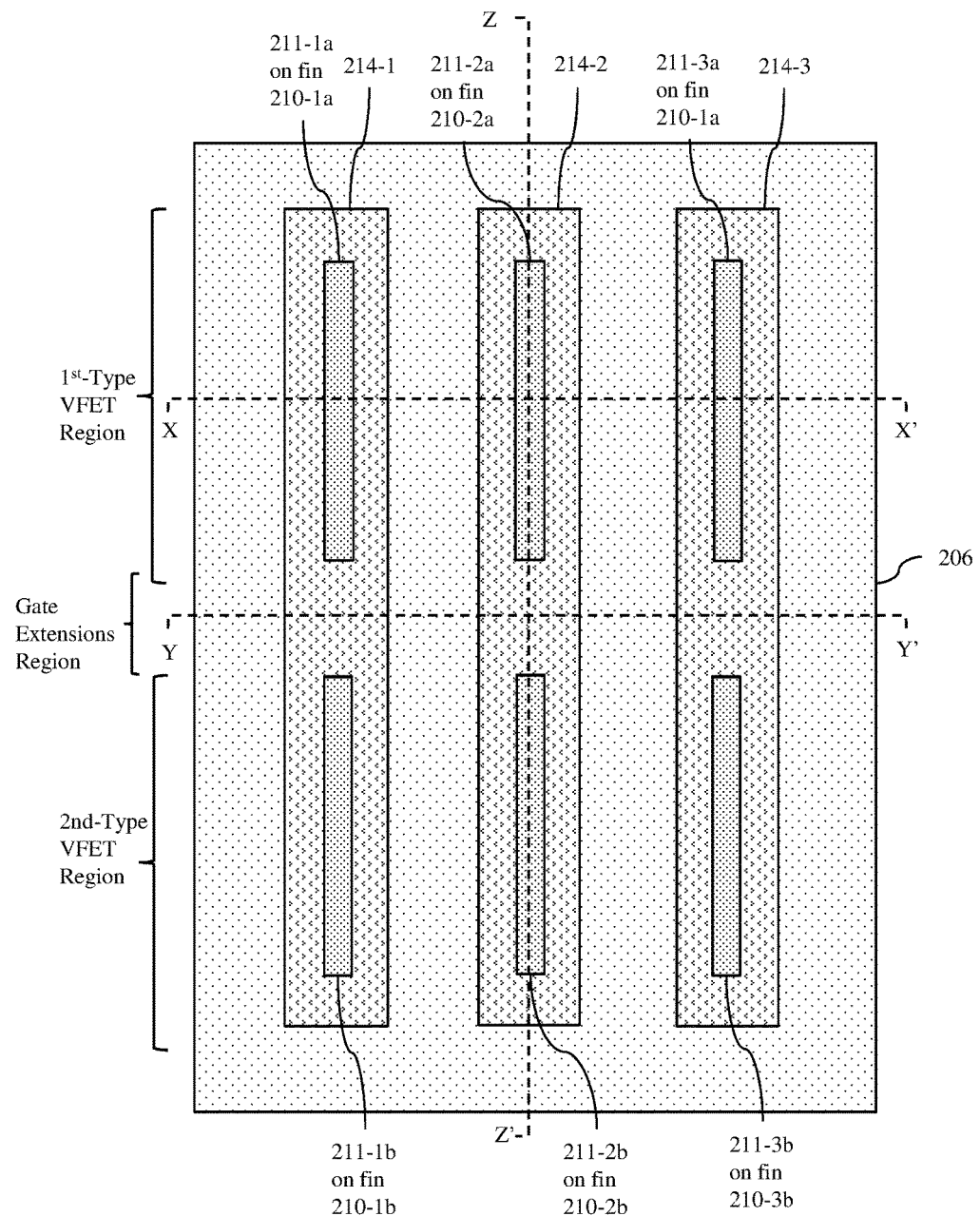
FIG. 8A is a top view diagram and FIGS. 8B-8D are different cross-section diagrams illustrating a partially completed IC structure formed according to the flow diagram of FIG. 1.
Figure 8B:
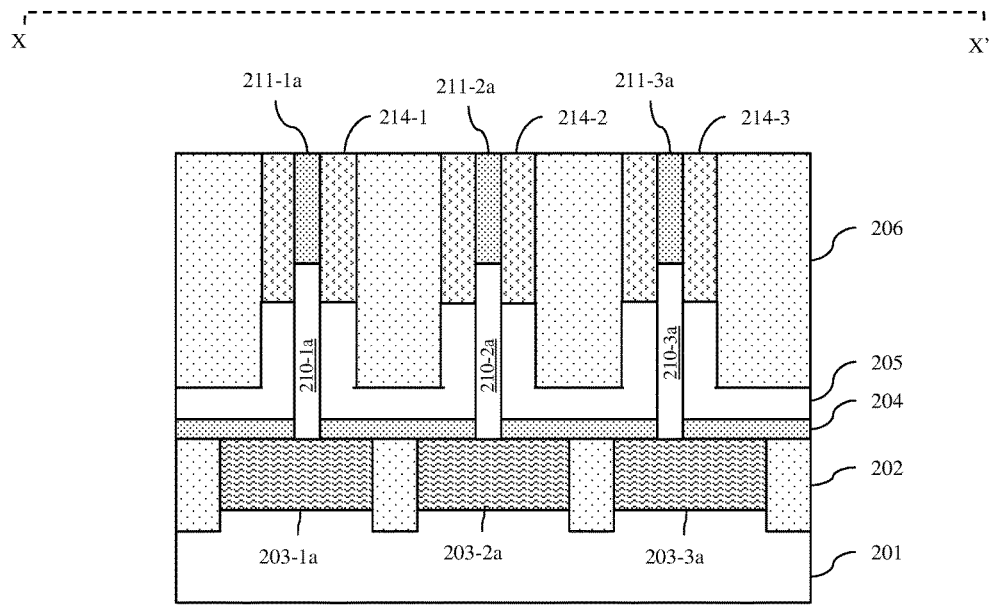
Figure 8C:
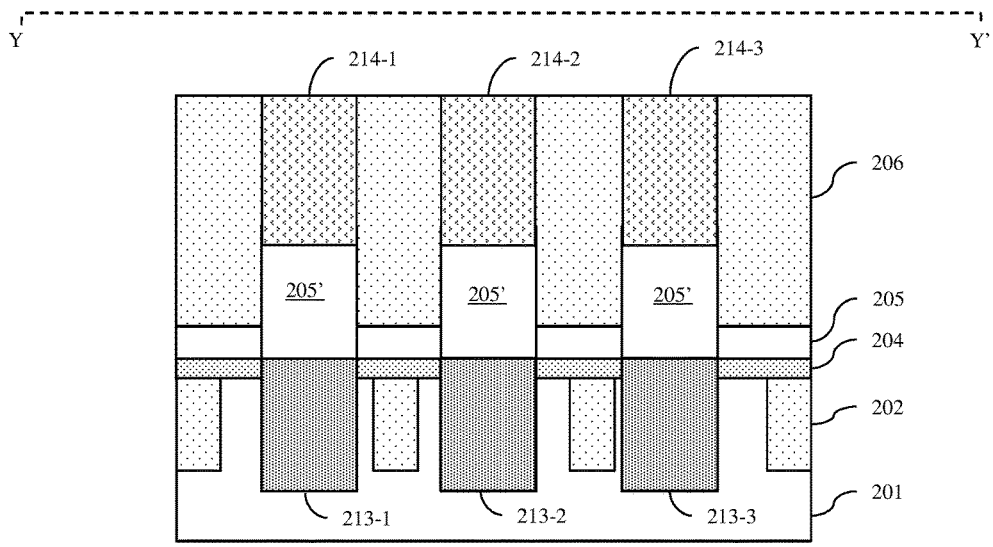
Figure 8D:
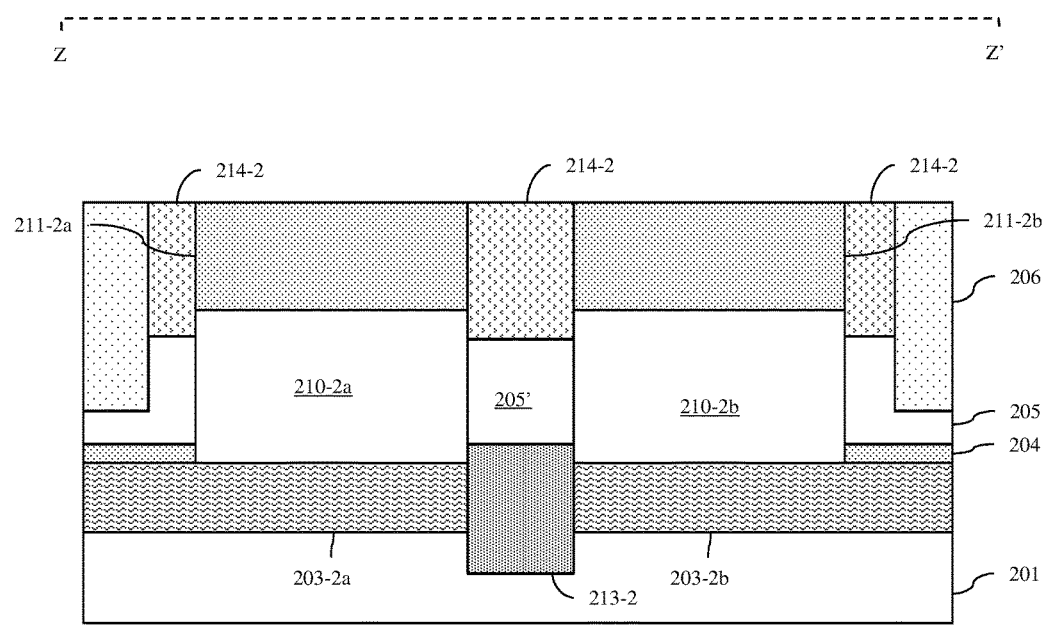

The sacrificial material of both the sacrificial gate layer 205 and the sacrificial regions 205' can be recessed (i.e., selectively etched back) to form recesses 290-1, 290-2, 290-3 (see process 114 and FIGS. 7A-7C). As illustrated, each recess 290-1, 290-2, 290-3 will have an area that extends laterally between adjacent ends of the semiconductor fins 210-1a and b, 210-2a and b, 210-3a and b in a corresponding pair of semiconductor fins. Additionally, each recess 290-1, 290-2, 290-3 will have areas that wrap around the upper portions of the semiconductor fins in that corresponding pair as well as the sacrificial fin caps on those semiconductor fins.

Dielectric spacer material can be deposited to fill the recesses 290-1, 290-2 and 290-3 and a polishing process (e.g., a CMP process) can be performed in order to remove any of the dielectric spacer material from above the layer of sacrificial dielectric material 206, thereby forming upper dielectric spacers 214-1, 214-2 and 214-3 in the recesses 290-1, 290-2, 290-3, respectively (see process 116 and FIGS. 8A-8D). The dielectric spacer material can, for example, be silicon carbide or silicon oxycarbide or any other suitable material that is different from the sacrificial dielectric material 206 and the dielectric material of the sacrificial fin caps 211-1a and b, 211-2a and b, and 211-3a and b. As illustrated, the polishing process can be performed so that the top surfaces of the sacrificial fin caps 211-1a and b, 211-2a and b, and 211-3a and b are exposed and, thus, so that each upper dielectric spacer will have a portion that extends laterally between adjacent ends of the upper portions of the semiconductor fins in a corresponding pair of semiconductor fins and also portions that wrap around the upper portions of the semiconductor fins in that corresponding pair as well as the sacrificial fin caps on those semiconductor fins.

Figure 9A:
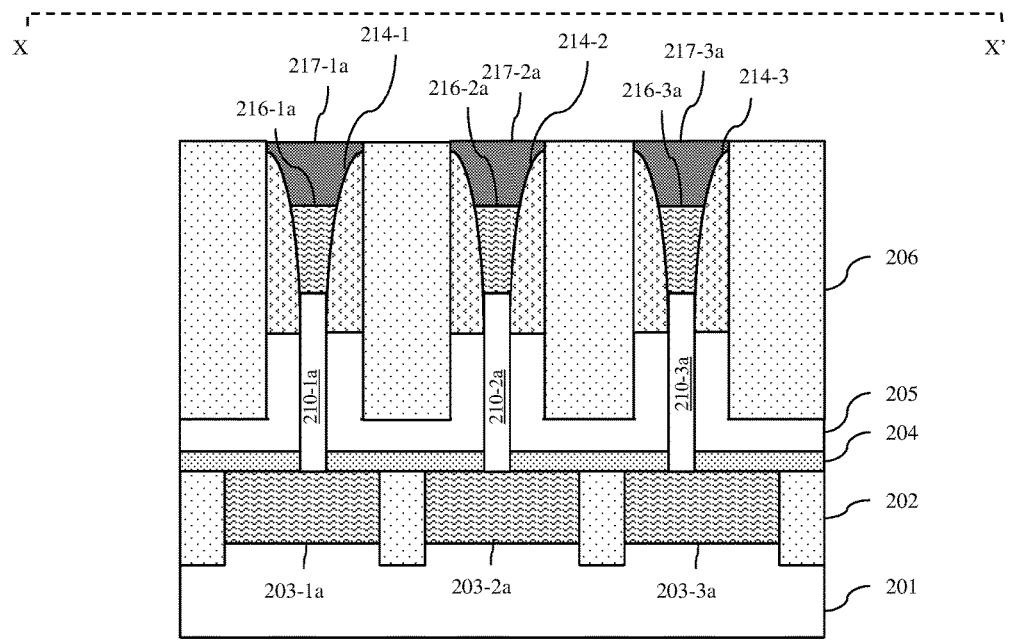
FIGS. 9A-9C are different cross-section diagrams illustrating a partially completed IC structure formed according to the flow diagram of FIG. 1.
Figure 9B:
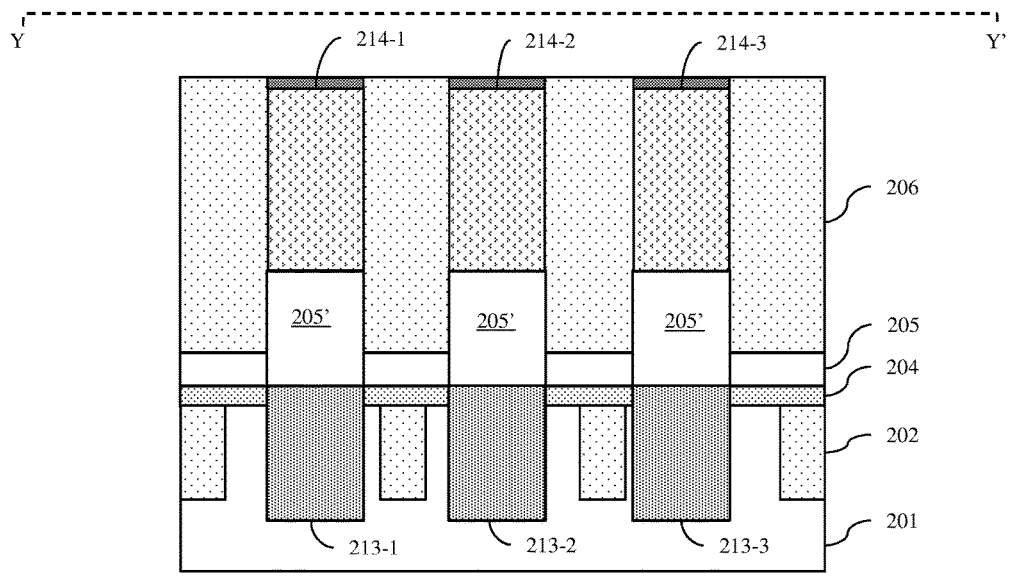
Figure 9C:
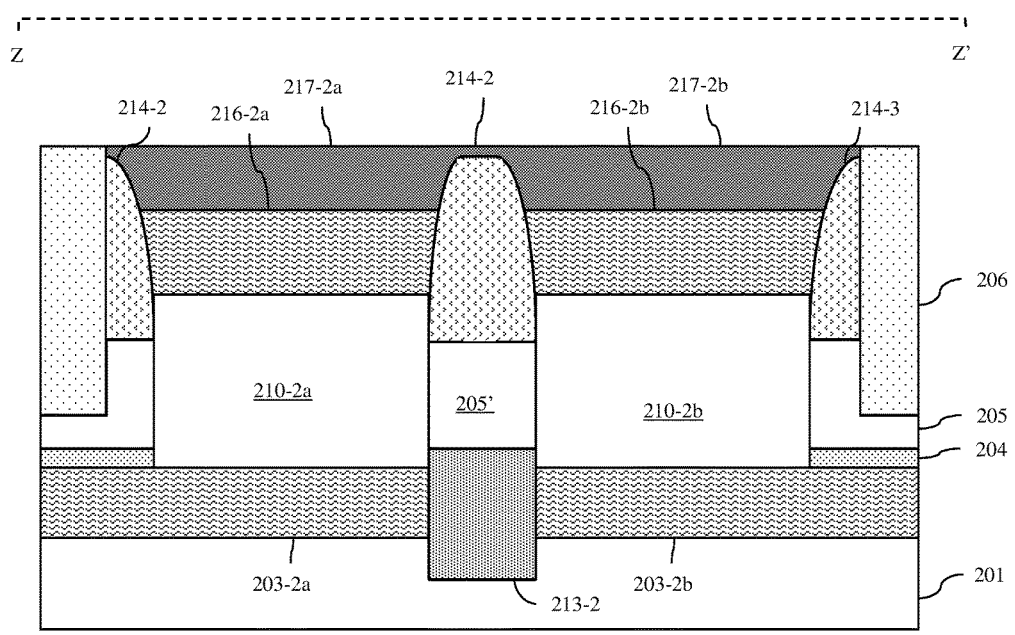

After the upper dielectric spacers 214-1, 214-2 and 214-3 are formed, the sacrificial fin caps can be selectively removed, upper source/drain regions can be formed on the top s of the semiconductor fins and dielectric caps can be formed on the upper source/drain regions (see process 118 and FIGS. 9A-9C). Specifically, a selective anisotropic etch process can be performed so as to selectively remove the sacrificial fin caps 211-1a and b, 211-2a and b, and 211-3a and b from the top surfaces of the semiconductor fins 210-1a and b, 210-2a and b, and 210-3a and b below. It should be noted that, depending upon the materials used, the etch process to remove the sacrificial fin caps may not have complete selectively relative to the upper dielectric spacers. Thus, as illustrated, this etch process may also etch back (e.g., curve) exposed corners of the upper dielectric spacers 214-1, 214-2 and 214-3; however, the lower portions of the upper dielectric spacers 214-1, 214-2 and 214-3 should remain fully intact. Upper source/drain regions 216-1a and b, 216-2a and b, 216-3a and b can then be formed on the exposed top surfaces of the semiconductor fins 210-1a and b, 210-2a and b, 210-3a and b, respectively, in the source/drain openings created by removal of the sacrificial fin caps. These upper source/drain regions 216-1a and b, 216-2a and b, 216-3a and b can be formed, for example, by epitaxial deposition of in-situ doped semiconductor material. As mentioned above, each pair of VFETs will typically be formed so as to include a P-type VFET and an N-type VFET. Thus, the upper source/drain regions above the semiconductor fins in a given pair will include a P+ upper source/drain region for a P-type VFET on one semiconductor fin and an N+ upper source/drain region for an N-type VFET on the other semiconductor fin. In this case, one VFET region of the partially completed structure could be masked (e.g., the VFET region containing the semiconductor fins 210-1b, 210-2b and 210-3b could be masked) during formation of the upper source/drain regions in the other VFET region and vice versa. Subsequently, a dielectric cap material (e.g., silicon nitride or some other dielectric cap material that is different from the dielectric materials of the upper dielectric spacers 214-1, 214-2, 214-3 and the layer of sacrificial dielectric material 206) can be deposited and and a polishing process (e.g., a CMP process) can be performed to remove the dielectric cap material from above the top surface of the layer of sacrificial dielectric material 206, thereby forming the dielectric caps 217-1a and b, 217-2a and b, 217-3a and b on the upper source/drain regions 216-1a and b, 216-2a and b, 216-3a and b, respectively. As illustrated, following process 118, each upper dielectric spacer will laterally surround the upper source/drain regions on a corresponding pair of semiconductor fins as well as the dielectric caps thereon.

Figure 10A:
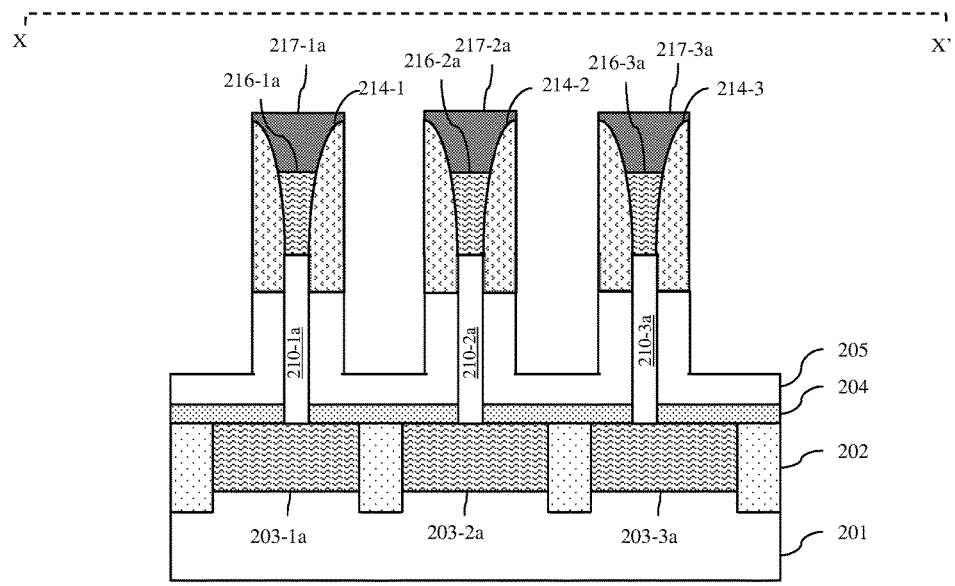
FIGS. 10A-10C are different cross-section diagrams illustrating a partially completed IC structure formed according to the flow diagram of FIG. 1.
Figure 10B:
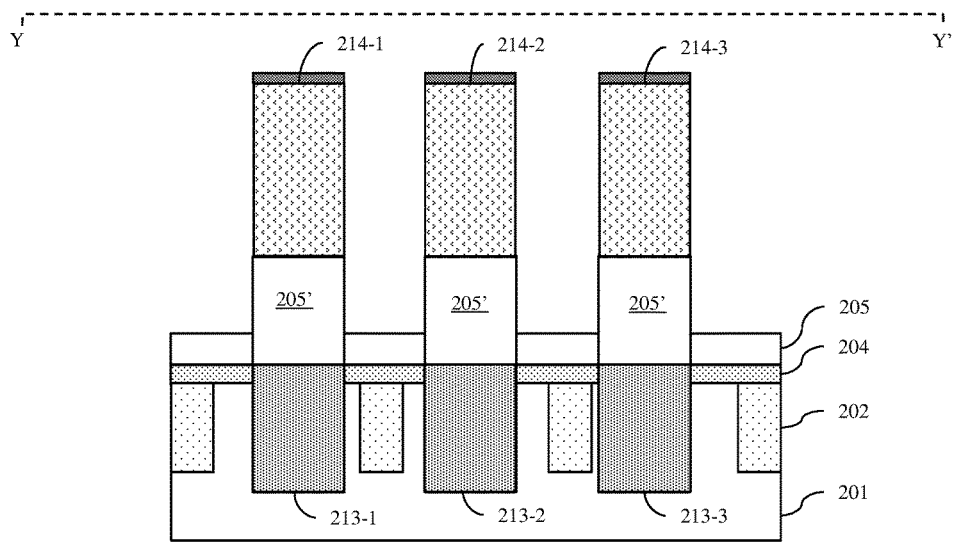
Figure 10C:
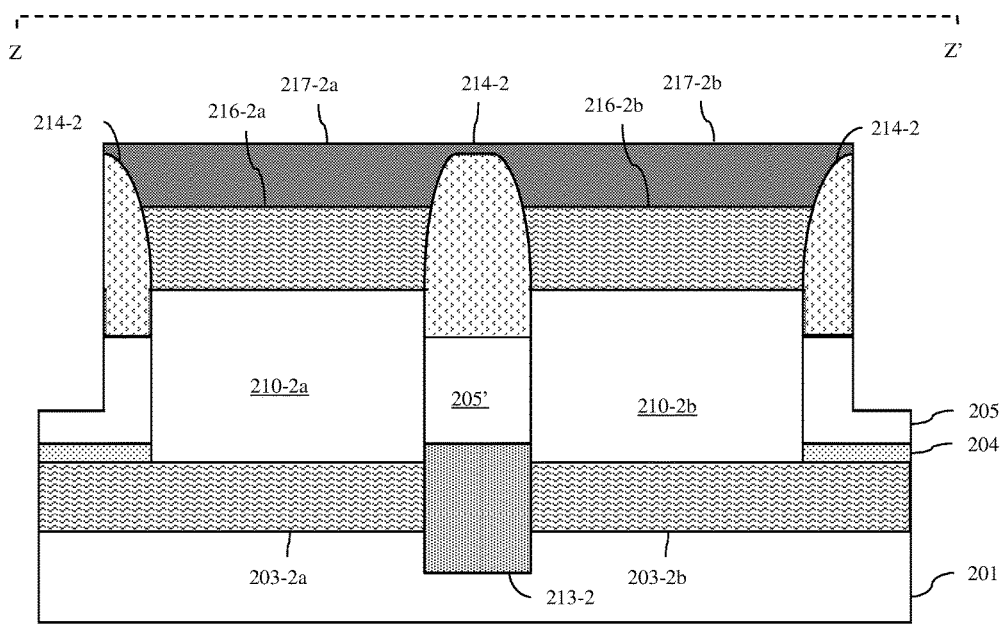
Figure 11A:
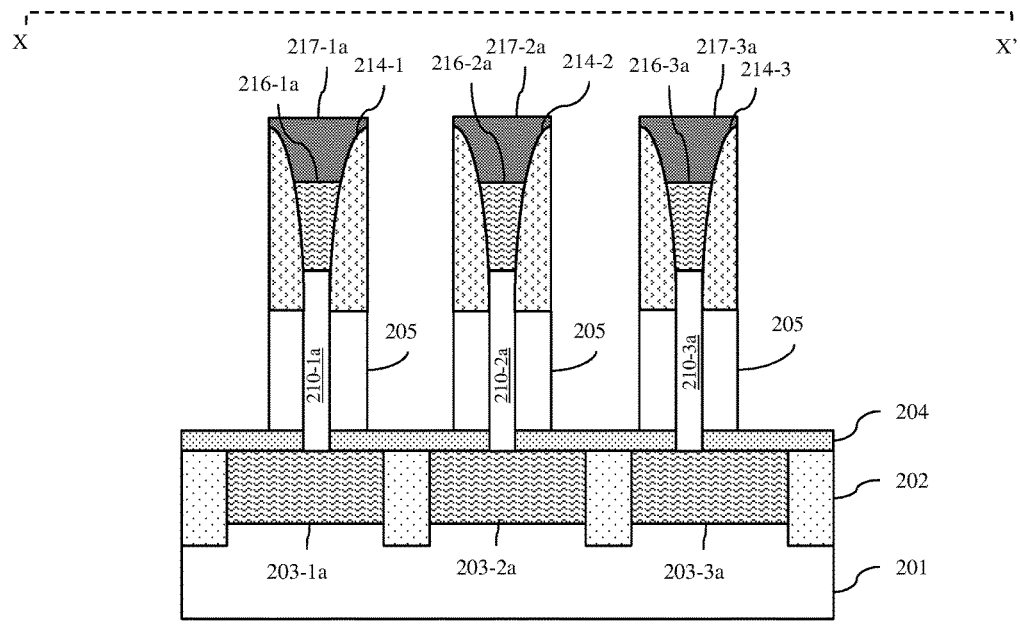
FIGS. 11A-11C are different cross-section diagrams illustrating a partially completed IC structure formed according to the flow diagram of FIG. 1.
Figure 11B:
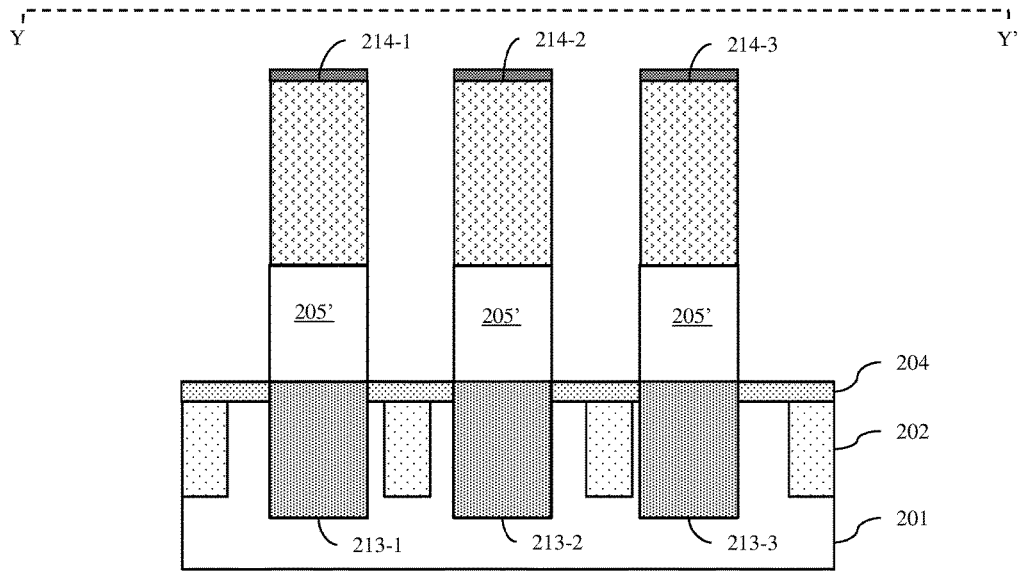
Figure 11C:
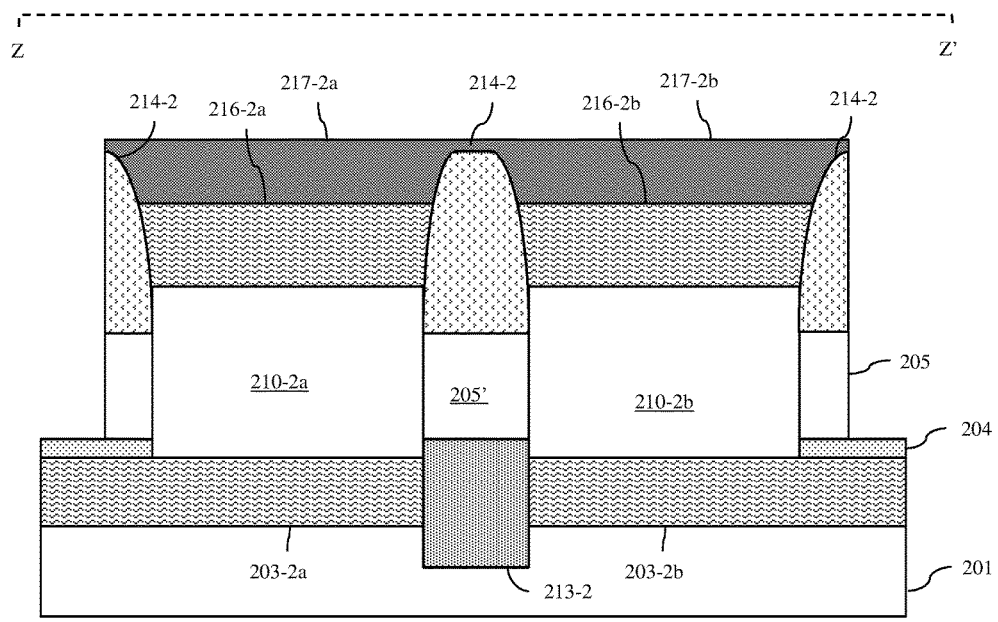
Figure 12A:
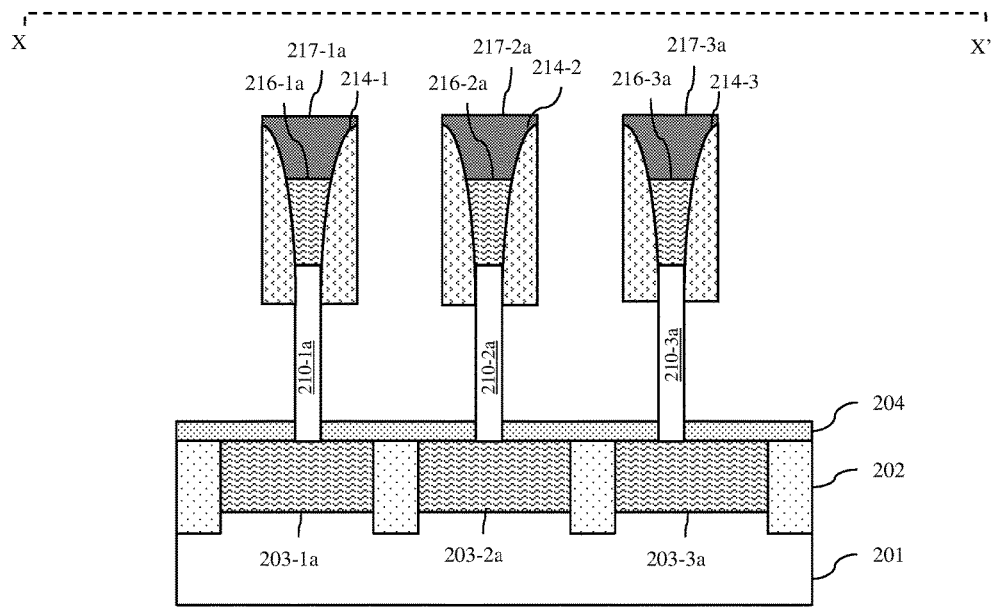
FIGS. 12A-12C are different cross-section diagrams illustrating a partially completed IC structure formed according to the flow diagram of FIG. 1.
Figure 12B:
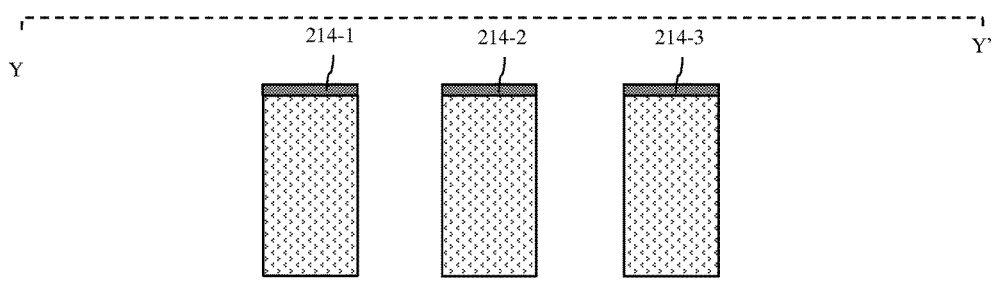
Figure 12C:
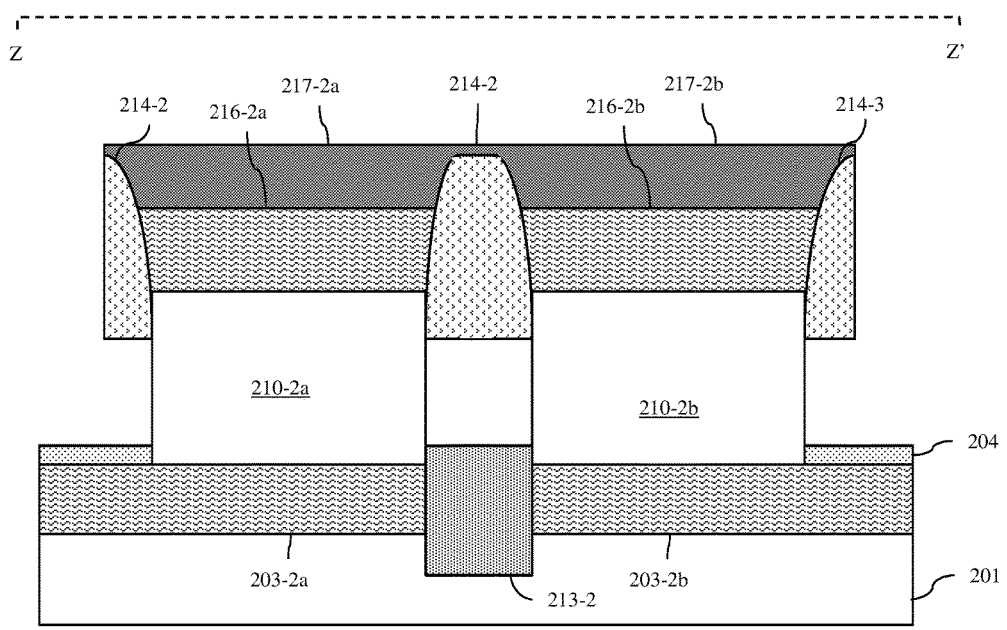
Figure 13A:
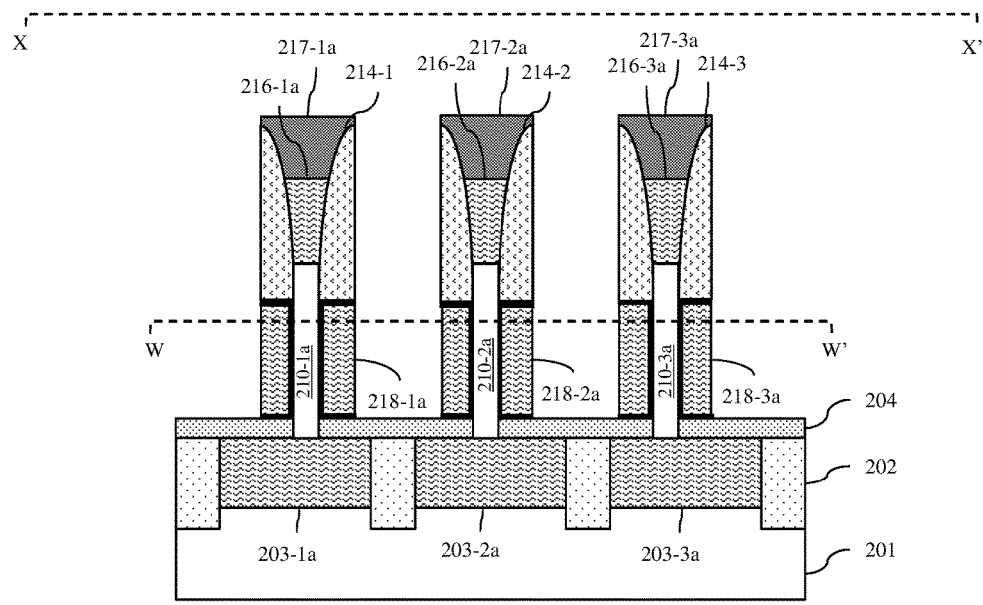
FIGS. 13A-13D are different cross-section diagrams illustrating a partially completed IC structure formed according to the flow diagram of FIG. 1.
Figure 13B:
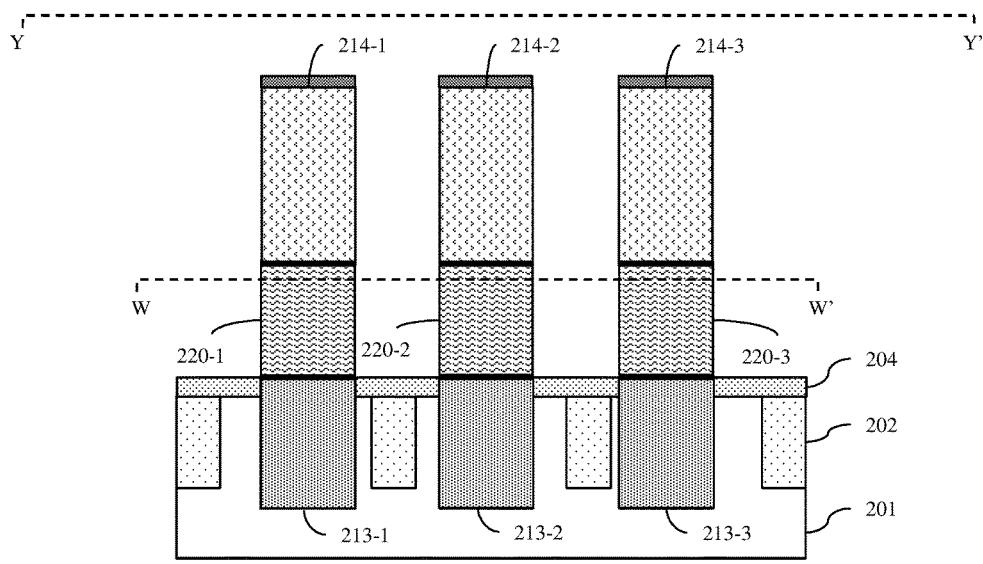
Figure 13C:
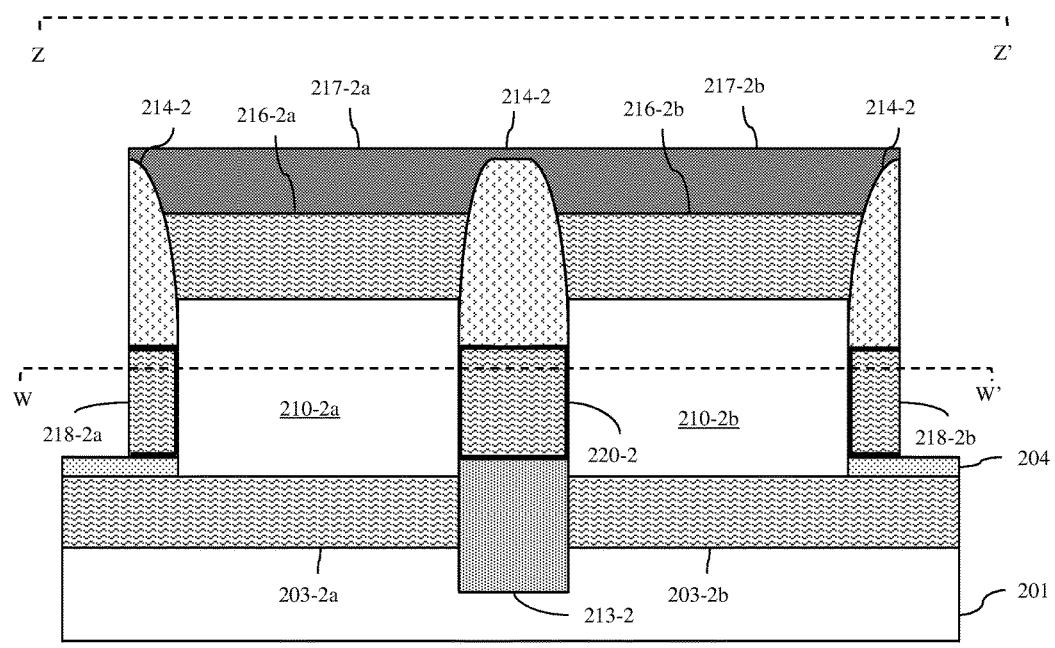
Figure 13D:
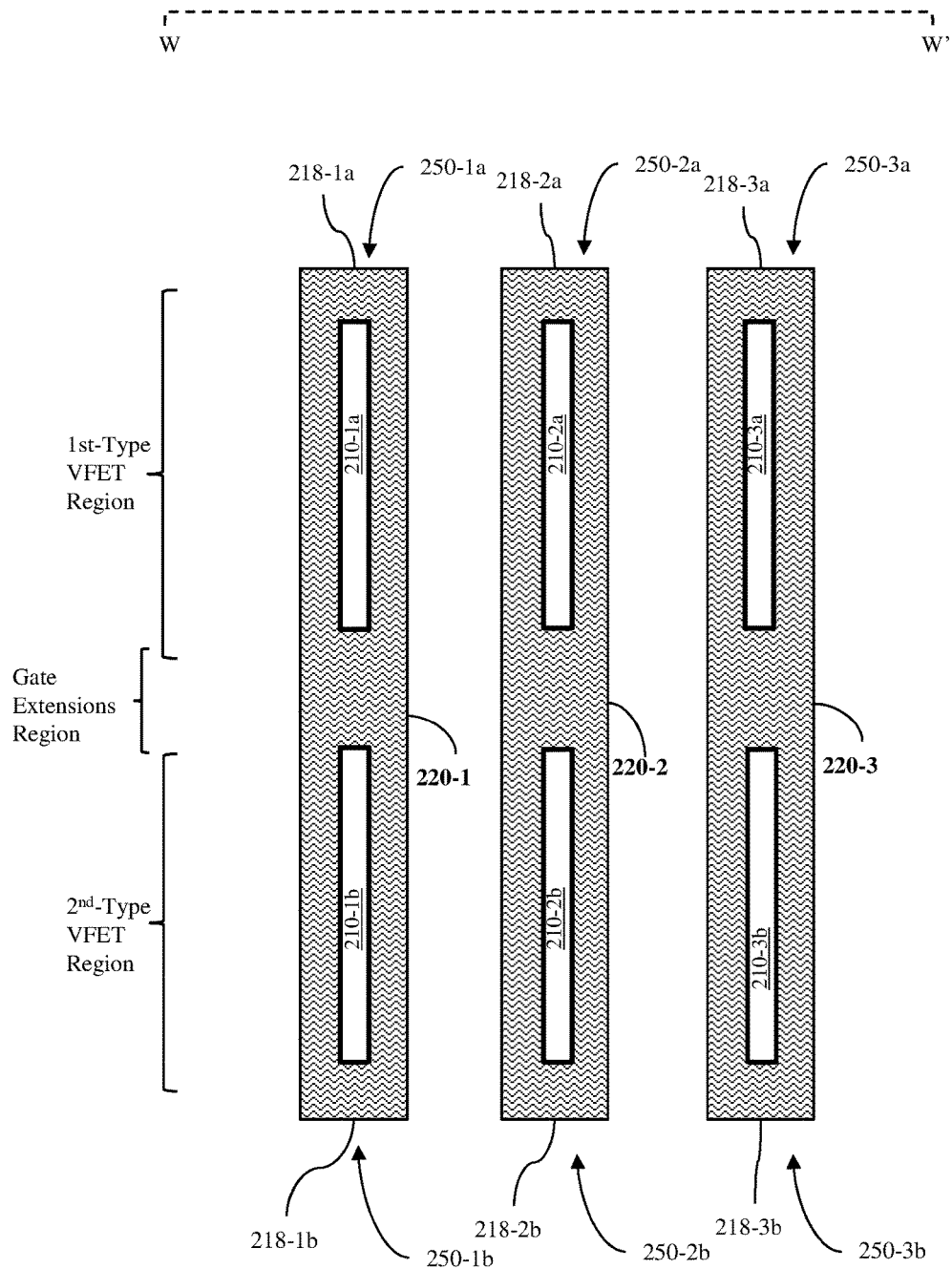

Following formation of the dielectric caps, the sacrificial dielectric material 206 can be selectively removed (see process 120 and FIGS. 10A-10C). That is, the sacrificial dielectric material 206 can be selective etched over the materials of the dielectric caps 217-1a and b, 217-2a and b, 217-3a and b and upper dielectric spacers 214-1, 214-2, 214-3 such that the dielectric caps 217-1a and b, 217-2a and b, 217-3a and b and upper dielectric spacers 214-1, 214-2, 214-3 remain intact, thereby protecting the upper source/drain regions 216-1a and b, 216-2a and b, 216-3a and b.

Next, one or more selective etch processes can be performed to selectively remove the remaining sacrificial material of the sacrificial gate layer 205 and the sacrificial regions 205' (see process 122 and FIGS. 11A-11C and 12A-12C). For example, a selective anisotropic etch process can be performed to expose a top surface of the lower dielectric spacer layer 204 (see FIGS. 11A-11C) and then a selective isotropic etch process can be performed to remove any remaining sacrificial material from below the upper dielectric spacers 214-1, 214-2, 214-3, thereby creating cavities that wrap around the center portions of each pair of semiconductor fins between below the upper dielectric spacers. That is, for each pair of semiconductor fins 210-1a and b, 210-2a and b, 210-3a and b, the resulting cavity will expose the vertical surfaces of the center portion of the semiconductor fins between the lower dielectric spacer layer 204 (below) and the upper dielectric spacer 214-1, 214-2, 214-3 (above) and also between the isolation region 213-1, 213-2, 213-3 (below) and the upper dielectric spacer 214-1, 214-2, 214-3 (above), respectively.

Self-aligned gates and a self-aligned gate extension can then be formed in each cavity using the upper dielectric spacer above as a mask (see process 124 and FIGS. 13A-13D). For example, a gate dielectric layer can be conformally deposited over the partially completed structure, gate conductor material can be deposited on the gate dielectric layer so as to fill the cavities and a selective anisotropic etch process can be perform, using the upper dielectric spacers as masks, to remove portions of the gate dielectric layer and the gate conductor material outside the cavities such that, within each cavity below each upper dielectric spacer, the gate dielectric layer and the gate conductor material extends laterally between the adjacent ends of the semiconductor fins of the corresponding pair and also wraps around the semiconductor fins of the corresponding pair. Thus, as illustrated, for the first pair of VFETs 250-1a and b, the self-aligned gates 218-1a and b will be positioned laterally adjacent to outer ends and opposing sides of the semiconductor fins 210-1a and b and the resulting self-aligned gate extension 220-1 will be within a space that is above the isolation region 213-1 and that extends laterally between and is in direct contact with the adjacent ends of the semiconductor fins 210-1a and b and both gates 218-1a and b. Similarly, for a second pair of VFETs 250-2a and b, the self-aligned gates 218-2a and b will be positioned laterally adjacent to outer ends and opposing sides of the semiconductor fins 210-2a and b and the resulting self-aligned gate extension 220-2 will be within a space that is above the isolation region 213-2 and that extends laterally between and is in direct contact with the adjacent ends of the semiconductor fins 210-2a and b and both gates 218-2a and b. Similarly, for a third pair of VFETs 250-3a and b, the self-aligned gates 218-3a and b will be positioned laterally adjacent to outer ends and opposing sides of the semiconductor fins 210-3a and b and the resulting self-aligned gate extension 220-3 will be within a space that is above the isolation region 213-3 and that extends laterally between and is in direct contact with the adjacent ends of the semiconductor fins 210-3a and b and both gates 218-3a and b.

It should be noted that the gate dielectric layer could be made, for example, of silicon dioxide or a high-K gate dielectric material. Those skilled in the art will recognize that a high-K gate dielectric material is a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The gate conductor material could be made, for example, of doped polysilicon. Alternatively, the gate conductor material could be made of a work function metal or metal alloy material that is preselected in order to achieve the optimal gate conductor work function given the conductivity type of the VFET. For example, the optimal gate conductor work function of N-type VFETs will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for P-type VFETs will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.).

As mentioned above, each pair of VFETs will typically be formed so as to include a P-type VFET and an N-type VFET. Thus, the gate conductor material that is deposited adjacent to one semiconductor fin in a pair may be different than the gate conductor material deposited adjacent to the other semiconductor fin in the same pair. In this case, one VFET region of the partially completed structure could be masked (e.g., the VFET region containing the semiconductor fins 210-1*b*, 210-2*b* and 210-3*b* could be masked) during gate conductor material deposition in the other VFET region and vice versa. Once the appropriate gate conductor materials are deposited, the selective anisotropic etch process would be perform, using the upper dielectric spacers as masks, to remove portions of the gate dielectric layer and the gate conductor materials outside the cavities, as discussed above.

Following the formation of the self-aligned gates and self-aligned gate extension for each pair of VFETs, interlayer dielectric material (ILD) 231 can be deposited o electrically isolate the self-aligned gates and the self-aligned gate extension of each pair of VFETs from the self-aligned gates and self-aligned gate extension of any other pair of VFETs (see process 126). The ILD material 231 include one or more dielectric layers. For example, the ILD material 231 can be silicon dioxide. Alternatively, the ILD material 231 can include a thin layer of silicon nitride and silicon dioxide on the silicon nitride. Alternatively, the ILD material 231 can include an optional silicon nitride layer and any of borophosphosilicate glass (BPSG), tetraethyl orthosilicate (TEOS), fluorinated tetraethyl orthosilicate (FTEOS), etc. Alternatively, the ILD material 231 can include one or more layers of any suitable ILD material.

Figure 14A:
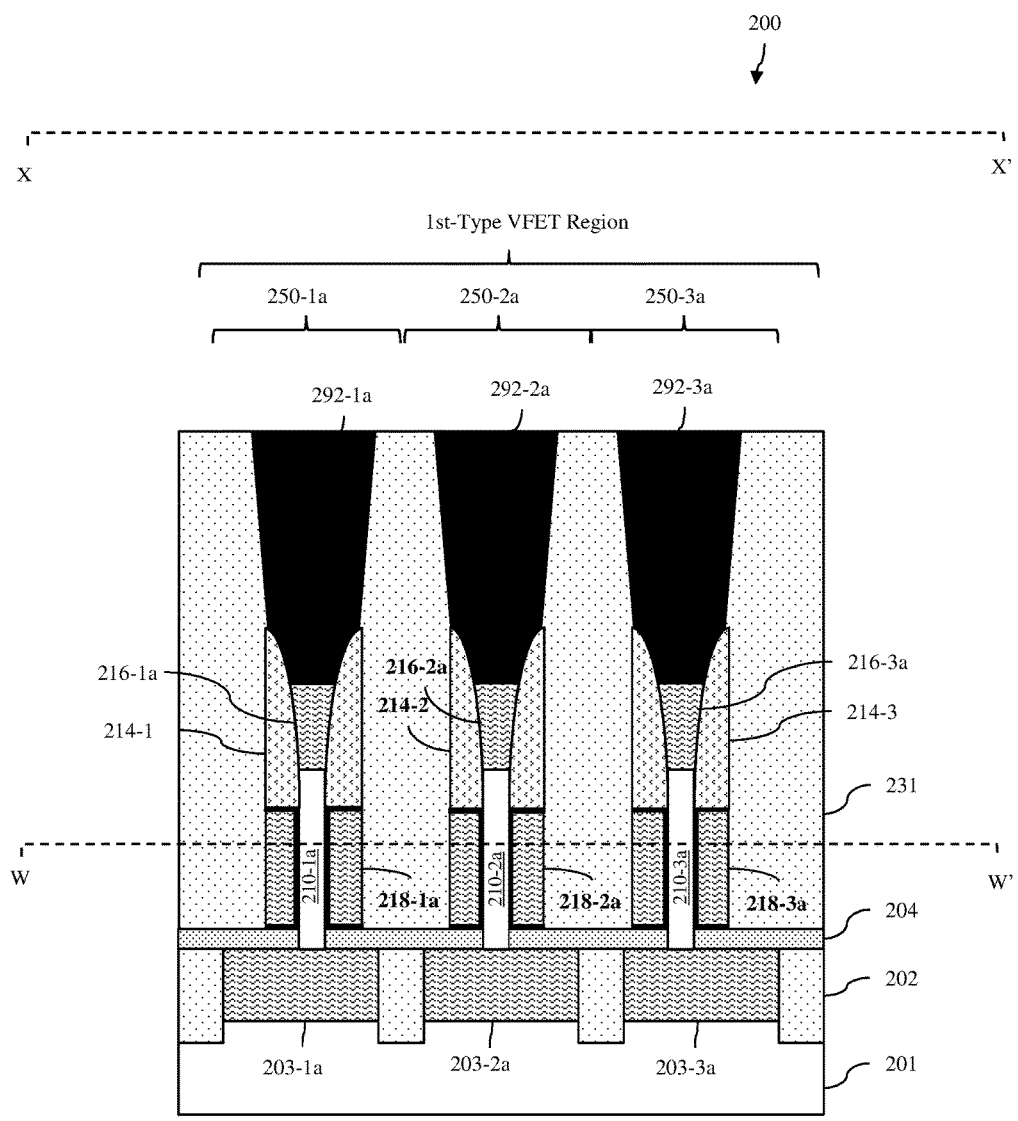
FIGS. 14A-14D are different cross-section diagrams illustrating an embodiment of an IC structure formed according to the flow diagram of FIG. 1.
Figure 14B:
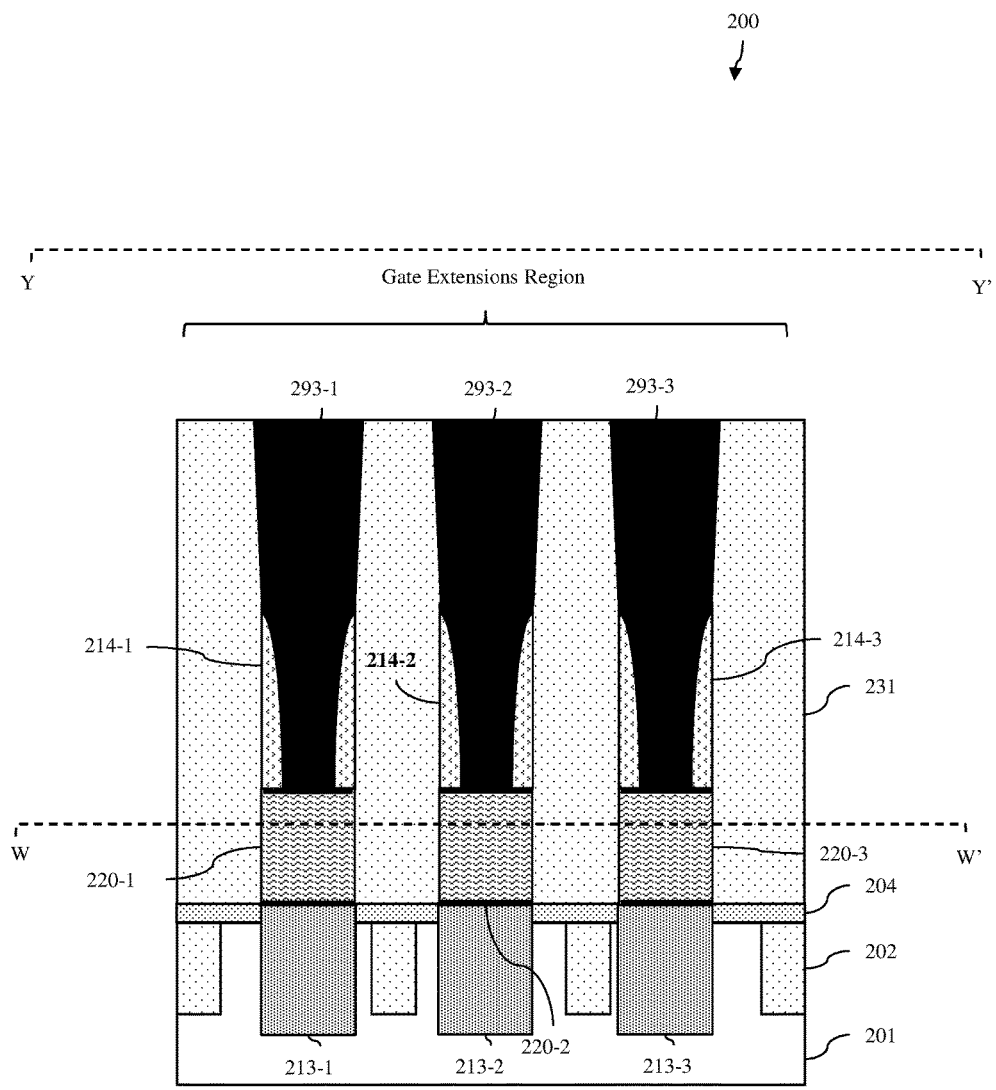
Figure 14C:
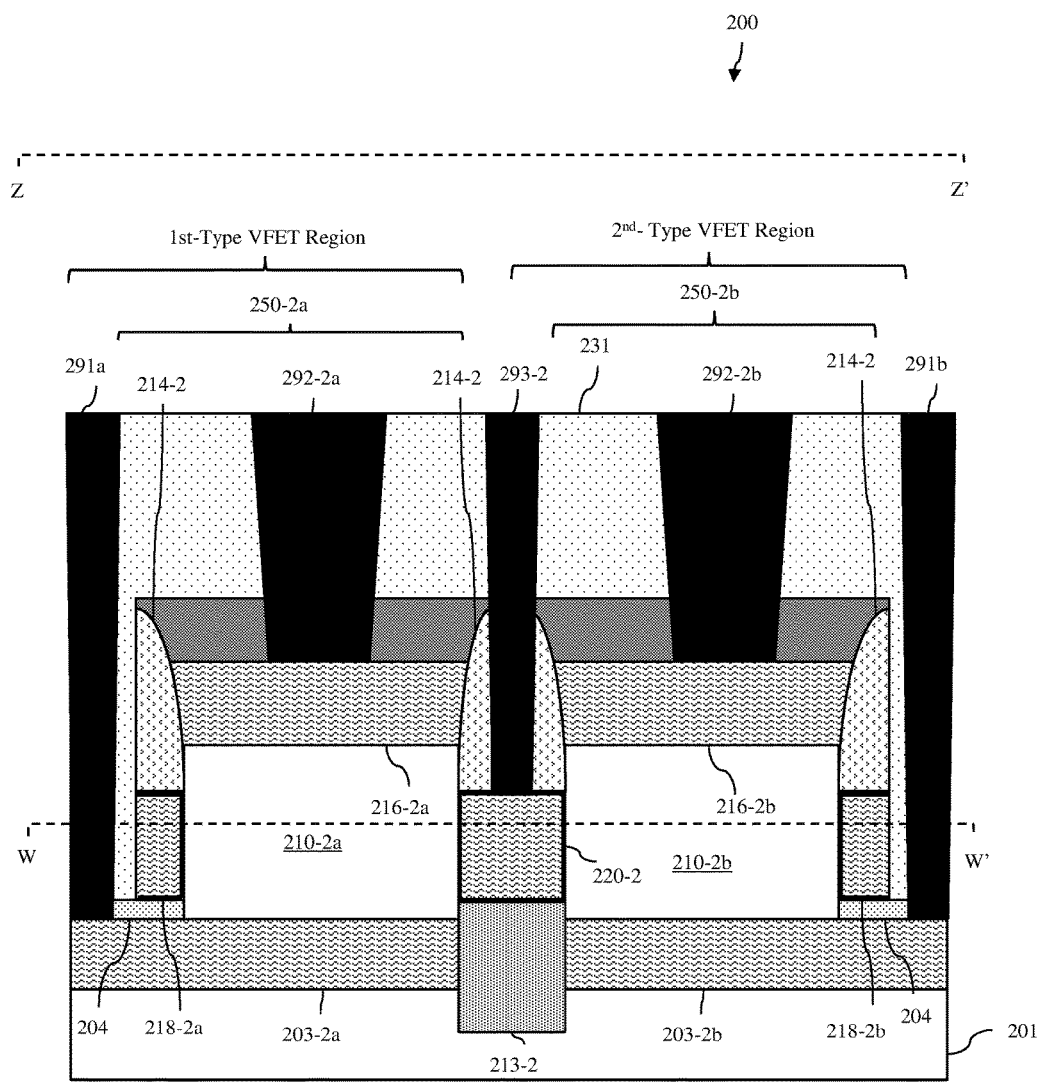
Figure 14D:
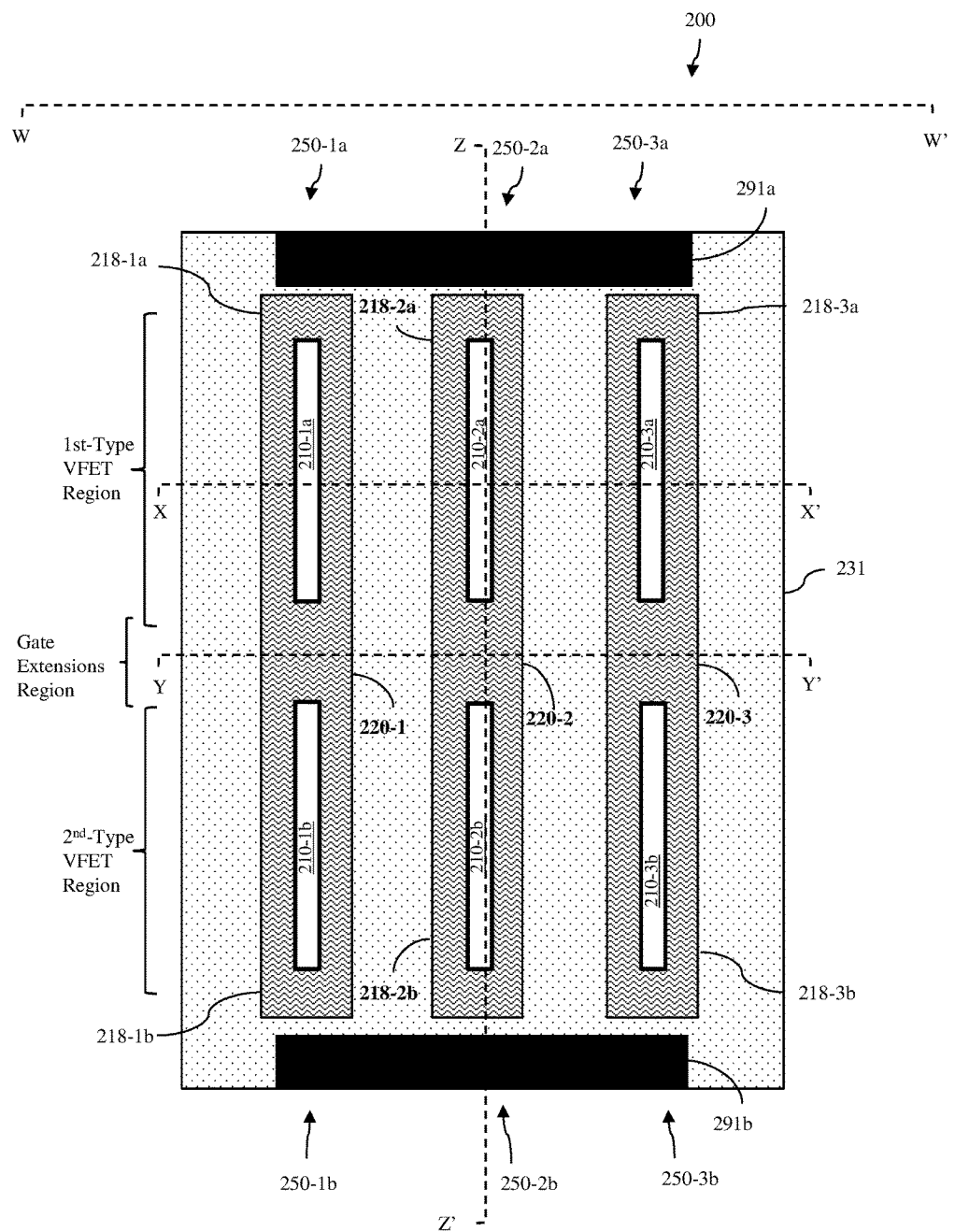

Additionally processing can subsequently be performed in order to complete each of the pairs of VFETs 250-1*a* and *b*, 250-2*a* and *b*, 250-3*a* and *b*. This additional processing can include, but is not limited to, the formation of contacts to the various components of these VFETs (see process 128 and FIGS. 14A-14D). Specifically, these contacts can include lower source/drain contacts that extend vertically through the ILD material 231 to the lower source/drain regions 203-1*a* and *b*, 203-2*a* and *b*, 203-3*a* and *b*. Optionally, as illustrated in FIG. 14D, the VFETs on one side of the partially completed structure (e.g., VFETs 250-1*a*, 250-2*a* and 250-3*a*) can share a single lower source/drain contact 291*a* and the VFETs on the opposite side (e.g., VFETs 250-1*b*, 250-2*b* and 250-3*b*) can similarly share a single lower source/drain contact 291*b*. Alternatively, the lower source/drain regions of each of the VFETs 250-1*a* and *b*, 250-2*a* and *b*, 250-3*a* and *b* can be individually contacted (not shown). These contacts can further include upper source/drain contacts 292-1*a* and *b*, 292-2*a* and *b*, 292-3*a* and *b* that extend vertically through the ILD material 231 and dielectric caps 217-1*a* and *b*, 217-2*a* and *b*, 217-3*a* and *b* to the upper source/drain regions 216-1*a* and *b*, 216-2*a* and *b*, 216-3*a* and *b* of each of the VFETs 250-1*a* and *b*, 250-2*a* and *b*, 250-3*a* and *b*, respectively. These contacts can further include one or more gate contacts (e.g., see exemplary gate contacts 293-1, 293-2, and 293-3 that extend vertically through the ILD material 231 and upper dielectric spacers 214-1, 214-2 and 214-3 to gate extensions 220-1, 220-2, and 220-3, respectively, for each pair of VFETs 250-1*a* and *b*, 250-2*a* and *b*, 250-3*a* and *b*).

Figure 15A:
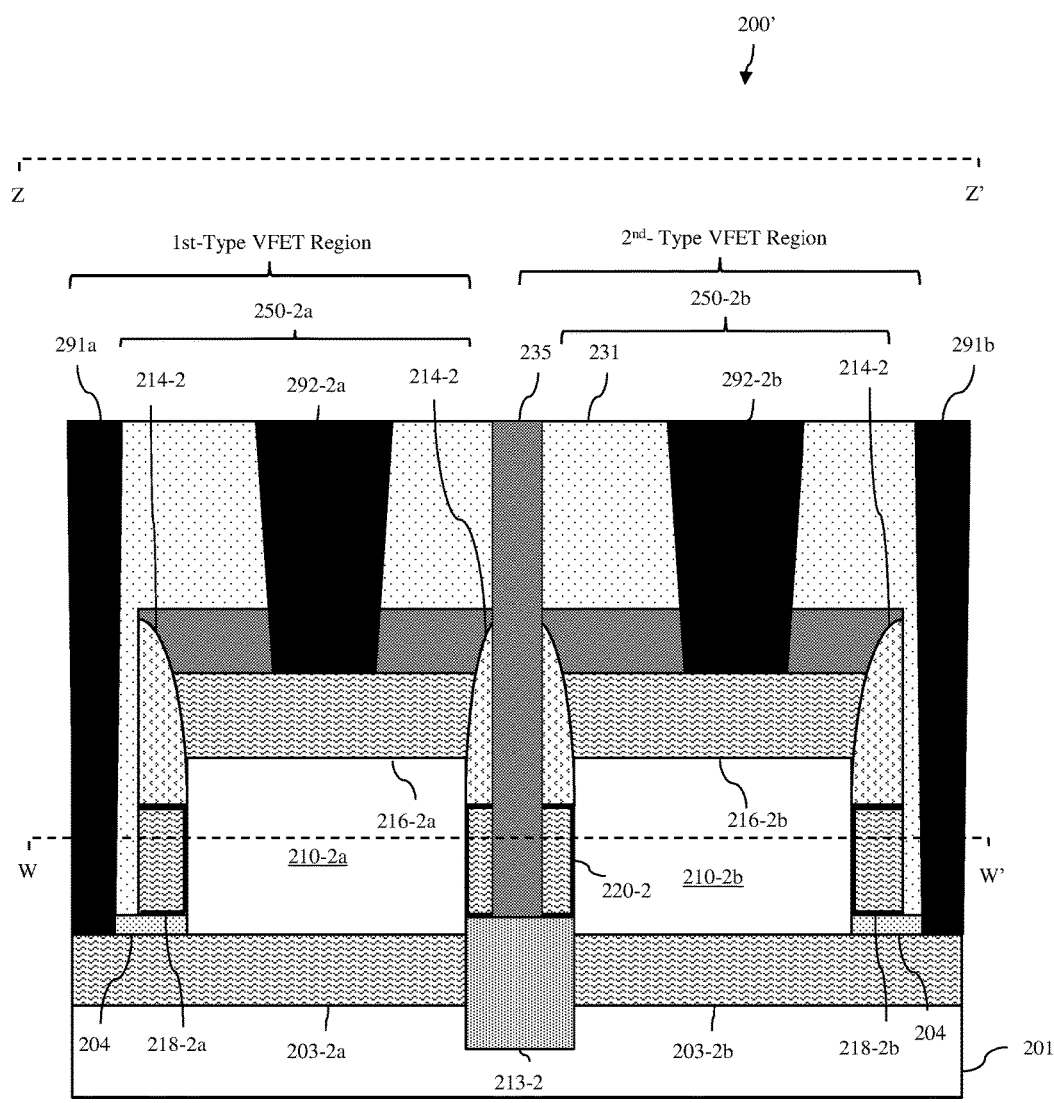
FIGS. 15A-15B are different cross-section diagrams illustrating another embodiment of an IC structure formed according to the flow diagram of FIG. 1.
Figure 15B:
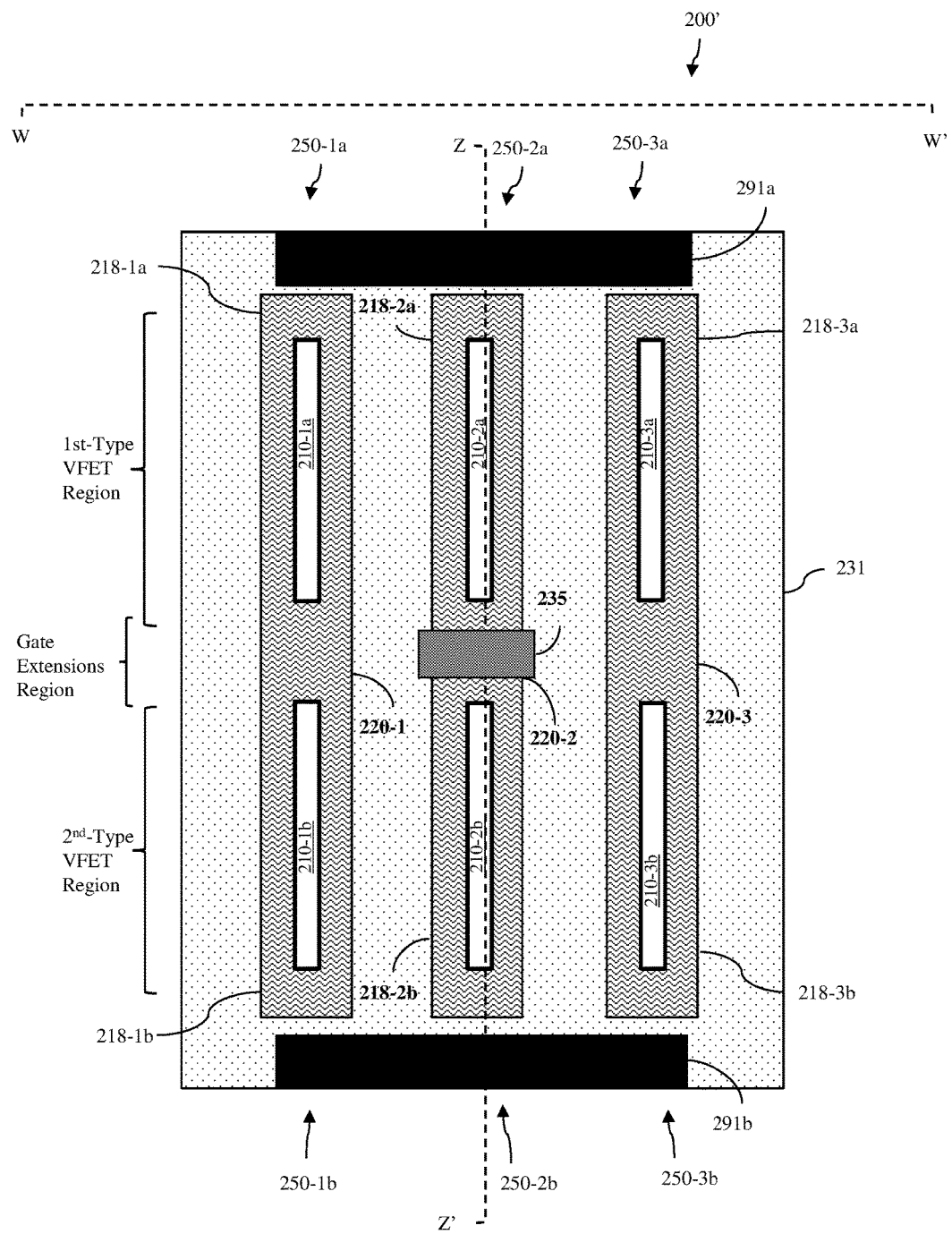

Optionally, at some point during processing (e.g., before or after contact formation), one or more extension cut isolation regions 235 can be formed (see process 130 and FIGS. 15A-15B). For example, an extension cut isolation region 235 can be formed in the second pair of VFETs 250-2*a* and *b*. In this case, a cut can be lithographically patterned and etched so that it extends vertically through the ILD material 231, through a portion of the spacer 214-2 and through the gate extension 220-2 down to the isolation region 213-2. An additional isolation material (e.g., silicon nitride or some other suitable isolation material) can be deposited so as to fill the cut and a polishing process (e.g., a CMP process) can be performed in order complete the extension cut isolation region 235. As illustrated, the extension cut isolation region 235 can be formed so as to completely traverse the gate extension 220-2 and, thus, so as to electrically isolate the gates 218-2*a* and *b* on either side of the gate extension 220-2 from each other. In this case, the gate extension 220-2 may remain uncontacted (i.e., gate contact 293-2 shown in FIGS. 14A-14D would not be formed).

Also disclosed herein are embodiments integrated circuit (IC) structure formed according to the above-describe method embodiments (e.g., see the embodiment 200 shown in FIGS. 14A-14D and the embodiment 200' shown in FIGS. 15A-15B). The IC structure 200, 200' can include a substrate 201. The substrate 201 can be a bulk semiconductor substrate (e.g., a bulk silicon substrate), as illustrated. Alternatively, the substrate 201 can be a semiconductor layer above an insulator layer of a semiconductor-on-insulator wafer (e.g., a silicon layer above a buried oxide layer of a silicon-on-insulator (SOI) wafer).

The IC structure 200, 200' can further include at least one pair of vertical field effect transistors (VFETs) on the substrate 201. For purposes of illustration, three pairs of VFETs 250-1*a* and *b*, 250-2*a* and *b*, and 250-3*a* and *b* are shown in the figures. However, it should be understood that the IC structure 200, 200' could include any number of one or more pairs of VFETs. The VFETs in each pair of VFETs can be formed so as to have the same type conductivity. However, typically, the VFETs in each pair of VFETs will be formed so as to have different type conductivities.

In any case, each pair of VFETs 250-1*a* and *b*, 250-2*a* and *b*, and 250-3*a* and *b* can include a pair of semiconductor fins 210-1*a* and *b*, 210-2*a* and *b*, and 210-3*a* and *b* and the semiconductor fins in each pair can be arranged in end-to-end alignment. For purposes of this disclosure, a semiconductor fin refers to an elongated, relatively tall and thin, essentially rectangular-shaped semiconductor body. The semiconductor fin can, for example, be a silicon fin formed in an upper portion of a silicon substrate.

Each pair of VFETs 250-1*a* and *b*, 250-2*a* and *b*, and 250-3*a* and *b* can further include pairs of lower source/drain regions 203-1*a* and *b*, 203-2*a* and *b*, and 203-3*a* and *b* in the substrate 201 and pairs of upper source/drain regions 216-1*a* and *b*, 216-2*a* and *b*, and 216-3*a* and *b* above the pairs of lower source/drain regions, respectively. The semiconductor fins 210-1a and b can extend essentially vertically between the lower source/drain regions 203-1a and 203-1b and the upper source/drain regions 216-1a and 216-1b, respectively. The semiconductor fins 210-2a and b can extend essentially vertically between the lower source/drain regions 203-2a and 203-2b and the upper source/drain regions 216-2a and 216-2b. The semiconductor fins 210-3a and b can extend essentially vertically between the lower source/drain regions 203-3a and 203-3b and the upper source/drain regions 216-3a and 216-3b. The method embodiments discussed above provide more detailed information regarding the conductivity types of the source/drain regions.

Each pair of VFETs 250-1a and b, 250-2a and b, and 250-3a and b can further include dielectric caps 217-1a and b, 217-2a and b, and 217-3a and b on the tops of the upper source/drain regions 216-1a and b, 216-2a and b, and 216-3a and b, respectively.

Each pair of VFETs 250-1a and b, 250-2a and b, and 250-3a and b can further include self-aligned gates 218-1a and b, 218-2a and b, and 218-3a and b and a self aligned gate extension 220-1, 220-2, 220-3, respectively. Specifically, the pair of VFETs 250-1a and b can include self-aligned gates 218-1a and b and a self-aligned gate extension 220-1. The self-aligned gates 218-1a and 1b can be positioned laterally adjacent to outer ends and opposing sides of the semiconductor fins 210-1a and b and can be electrically isolated from the lower source/drain regions 203-1a and b, respectively, by a lower dielectric spacer layer 204. The self-aligned gate extension 220-1 can be above an isolation region 213-1 and can extend laterally between and be in direct contact with adjacent ends of the semiconductor fins 210-1a and b and with the gates 218-1a and b. The pair of VFETs 250-2a and b can include self-aligned gates 218-2a and b and a self-aligned gate extension 220-2. The self-aligned gates 218-2a and b can be positioned laterally adjacent to outer ends and opposing sides of the semiconductor fins 210-2a and b and can be electrically isolated from the lower source/drain regions 203-2a and b, respectively, by the lower dielectric spacer layer 204. The self-aligned gate extension 220-2 can be above an isolation region 213-2 and can extend laterally between and be in direct contact with adjacent ends of the semiconductor fins 210-2a and b and with the gates 218-2a and b. The pair of VFETs 250-3a and b can include self-aligned gates 218-3a and b and a self-aligned gate extension 220-3. The self-aligned gates 218-3a and b can be positioned laterally adjacent to outer ends and opposing sides of the semiconductor fins 210-3a and b and can be electrically isolated from the lower source/drain regions 203-3a and b, respectively, by the lower dielectric spacer layer 204. The self-aligned gate extension 220-3 can be above an isolation region 213-3 and can extend laterally between and be in direct contact with adjacent ends of the semiconductor fins 210-3a and b and with the gates 218-3a and b. The method embodiments discussed above provide more detailed information regarding the gate conductor materials and the lower dielectric spacer layer material that can be incorporated into each VFET.

Each pair of VFETs 250-1a and b, 250-2a and b, and 250-3a and b can further include an upper dielectric spacer 214-1, 214-2, and 214-3, respectively. Specifically, the pair of VFETs 250-1a and b can include an upper dielectric spacer 214-1, which has a portion aligned above the self-aligned gate extension 220-1 and which also has portions above the self-aligned gates 218-1a and b and wrapping around the upper source/drain regions 216-1a and b as well as the dielectric caps on those upper source/drain regions. The pair of VFETs 250-2a and b can include an upper dielectric spacer 214-2, which has a portion aligned above the self-aligned gate extension 220-2 and which also has portions above the self-aligned gates 218-2a and b and wrapping around the upper source/drain regions 216-2a and b as well as the dielectric caps on those upper source/drain regions. The pair of VFETs 250-3a and b can include an upper dielectric spacer 214-3, which has a portion aligned above the self-aligned gate extension 220-3 and which also has portions above the self-aligned gates 218-3a and b and wrapping around the upper source/drain regions 216-3a and b as well as the dielectric caps on those upper source/drain regions.

The IC structure 200, 200' can further include interlayer dielectric material (ILD) 231, which covers, wraps around and extends between the pairs of VFETs 250-1a and b, 250-2a and b, and 250-3a and b. Thus, the ILD material 231 will electrically isolate the self-aligned gates and the self-aligned gate extension of each pair of VFETs from the self-aligned gates and self-aligned gate extension of any other pair of VFETs. The ILD material 231 include one or more dielectric layers. For example, the ILD material 231 can be silicon dioxide. Alternatively, the ILD material 231 can include a thin layer of silicon nitride and silicon dioxide on the silicon nitride. Alternatively, the ILD material 231 can include an optional silicon nitride layer and borophosphosilicate glass (BPSG), tetraethyl orthosilicate (TEOS), fluorinated tetraethyl orthosilicate (FTEOS), etc. Alternatively, the ILD material 231 can include one or more layers of any suitable ILD material.

The IC structure 200, 200' can further include contacts to the various components of the pairs of VFETs. For example, these contacts can include lower source/drain contacts that extend vertically through the ILD material 231 to the lower source/drain regions 203-1a and b, 203-2a and b, 203-3a and b. Optionally, as illustrated in FIGS. 14D and 15B, the VFETs 250-1a, 250-2a and 250-3a can share a single lower source/drain contact 291a and the VFETs 250-1b, 250-2b and 250-3b can similarly share a single lower source/drain contact 291b. Alternatively, the lower source/drain regions of each of the VFETs 250-1a and b, 250-2a and b, 250-3a and b can be individually contacted (not shown). These contacts can further include upper source/drain contacts 292-1a and b, 292-2a and b, 292-3a and b that extend vertically through the ILD material 231 and dielectric caps 217-1a and b, 217-2a and b, 217-3a and b to the upper source/drain regions 216-1a and b, 216-2a and b, 216-3a and b of each of the VFETs 250-1a and b, 250-2a and b, 250-3a and b, respectively. These contacts can further gate contacts. For example, see FIGS. 14A-14D and the exemplary gate contacts 293-1, 293-2, and 293-3 that extend vertically through the ILD material 231 and upper dielectric spacers 214-1, 214-2 and 214-3 to gate extensions 220-1, 220-2, and 220-3, respectively, for each pair of VFETs 250-1a and b, 250-2a and b, 250-3a and b.

Optionally, the disclosed IC structure 200' can further include one or more extension cut isolation regions 235, as shown in FIGS. 15A-15B. For example, the pair of VFETs 250-2a and b can include an extension cut isolation region that extends vertically through the ILD material 231, through a portion of the spacer 214-2 and through the gate extension 220-2 down to the isolation region 213-2. This extension cut isolation region 235 can be formed as a cut, which is lithographically patterned and etched and then filled with an additional isolation material (e.g., silicon nitride or some other suitable isolation material). As illustrated, the extension cut isolation region 235 can be formed so as to completely traverse the gate extension 220-2 and, thus, so as to electrically isolate the gates 218-2a and b on either side of the gate extension 220-2 from each other. In this case, the gate extension 220-2 may remain uncontacted (i.e., gate contact 293-2 shown in FIGS. 14A-14D would not be present).

In the above-described methods and structure, different dopants can be used to achieve the desired conductivity types in the S/D regions of each VFET. Those skilled in the art will recognize that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). A gallium nitride (GaN)-based semiconductor material having P-type conductivity is typically doped with magnesium (Mg), whereas a gallium nitride (GaN)-based semiconductor material having N-type conductivity is typically doped with silicon (Si). Additionally, those skilled in the art will also recognize that different conductivity levels will depend upon the relative concentration levels of dopants.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit structure comprising:
   a substrate; and
   a pair of transistors on the substrate and comprising:
      a pair of semiconductor fins, the semiconductor fins in the pair extending vertically between lower source/drain regions in the substrate and upper source/drain regions, respectively, and the semiconductor fins being in end-to-end alignment;
      gates positioned laterally adjacent to outer ends and opposing sides of the semiconductor fins;
      a gate extension above an isolation region and extending laterally between and in direct contact with adjacent ends of the semiconductor fins and with the gates; and
      a spacer above the gate extension and further above the gates and wrapping around the upper source/drain regions.

2. The integrated circuit structure of claim 1, wherein sidewalls of the spacer are aligned vertically with sidewalls of the gates and the gate extension below.

3. The integrated circuit structure of claim 1, the isolation region being between the lower source/drain regions.

4. The integrated circuit structure of claim 1, further comprising a spacer layer on the substrate and electrically isolating the gates from the lower source/drain regions.

5. The integrated circuit structure of claim 1, further comprising a gate contact extending through interlayer dielectric material and the spacer to the gate extension.

6. The integrated circuit structure of claim 1, further comprising an extension cut isolation region extending through interlayer dielectric material, the spacer and the gate extension to the isolation region.

7. The integrated circuit structure of claim 1, further comprising a second pair of transistors on the substrate and parallel to the pair of transistors, wherein interlayer dielectric material electrically isolates second gates and a second gate extension of the second pair of transistors from the gates and the gate extension of the pair of transistors.

* * * * *